United States Patent
Chen et al.

(10) Patent No.: US 12,456,623 B2
(45) Date of Patent: Oct. 28, 2025

(54) REPLACEMENT GATE METHODS THAT INCLUDE TREATING SPACERS TO WIDEN GATE

(71) Applicant: Taiwan Semiconductor Manufacturing Co., Ltd., Hsinchu (TW)

(72) Inventors: Shu-Han Chen, Hsinchu (TW); Tsung-Ju Chen, Hsinchu (TW); Ta-Hsiang Kung, New Taipei (TW); Xiong-Fei Yu, Hsinchu (TW); Chi On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 101 days.

(21) Appl. No.: 18/411,197

(22) Filed: Jan. 12, 2024

(65) Prior Publication Data

US 2024/0145250 A1 May 2, 2024

Related U.S. Application Data

(60) Continuation of application No. 17/377,839, filed on Jul. 16, 2021, now Pat. No. 11,908,695, which is a
(Continued)

(51) Int. Cl.
*H10D 30/01* (2025.01)
*H01L 21/02* (2006.01)
(Continued)

(52) U.S. Cl.
CPC .... *H01L 21/28141* (2013.01); *H01L 21/0234* (2013.01); *H01L 21/28518* (2013.01);
(Continued)

(58) Field of Classification Search
CPC ........... H01L 21/28141; H01L 21/0234; H01L 21/28518; H01L 21/31055;
(Continued)

(56) References Cited

U.S. PATENT DOCUMENTS 8,957,465 B2 2/2015 Xie et al.
9,190,272 B1 11/2015 Park et al.
(Continued)

FOREIGN PATENT DOCUMENTS

JP 2014103339 A 6/2014

*Primary Examiner* — Elias Ullah
(74) *Attorney, Agent, or Firm* — Slater Matsil, LLP

(57) ABSTRACT

A method may include forming a dummy dielectric layer over a substrate, and forming a dummy gate over the dummy dielectric layer. The method may also include forming a first spacer adjacent the dummy gate, and removing the dummy gate to form a cavity, where the cavity is defined at least in part by the first spacer. The method may also include performing a plasma treatment on portions of the first spacer, where the plasma treatment causes a material composition of the portions of the first spacer to change from a first material composition to a second material composition. The method may also include etching the portions of the first spacer having the second material composition to remove the portions of the first spacer having the second material composition, and filling the cavity with conductive materials to form a gate structure.

20 Claims, 21 Drawing Sheets

Related U.S. Application Data division of application No. 16/460,363, filed on Jul. 2, 2019, now Pat. No. 11,069,531.

(60) Provisional application No. 62/753,166, filed on Oct. 31, 2018.

(51) Int. Cl.

| | |
|---|---|
| *H01L 21/28* | (2006.01) |
| *H01L 21/285* | (2006.01) |
| *H01L 21/3105* | (2006.01) |
| *H01L 21/311* | (2006.01) |
| *H10D 30/62* | (2025.01) |
| *H10D 62/13* | (2025.01) |
| *H10D 64/01* | (2025.01) |
| *H10D 64/27* | (2025.01) |
| *H10D 64/62* | (2025.01) |
| *H10D 64/66* | (2025.01) |
| *H10D 84/01* | (2025.01) |
| *H10D 84/03* | (2025.01) |

(52) U.S. Cl.
CPC .. *H01L 21/31055* (2013.01); *H01L 21/31116* (2013.01); *H10D 30/024* (2025.01); *H10D 30/62* (2025.01); *H10D 30/6211* (2025.01); *H10D 30/6217* (2025.01); *H10D 62/151* (2025.01); *H10D 64/015* (2025.01); *H10D 64/017* (2025.01); *H10D 64/021* (2025.01); *H10D 64/513* (2025.01); *H10D 64/517* (2025.01); *H10D 64/62* (2025.01); *H10D 64/671* (2025.01); *H10D 84/0142* (2025.01); *H10D 84/0147* (2025.01); *H10D 84/038* (2025.01)

(58) Field of Classification Search
CPC ....... H01L 21/31116; H01L 21/823456; H01L 21/823468; H01L 29/0847; H01L 29/4236; H01L 29/42372; H01L 29/45; H01L 29/4983; H01L 29/6653; H01L 29/66545; H01L 29/6656; H01L 29/66795; H01L 29/785; H01L 29/7851; H01L 29/7856; H01L 21/3105; H01L 29/66803

See application file for complete search history.

(56) References Cited

U.S. PATENT DOCUMENTS

| | | | |
|---|---|---|---|
| 9,450,099 | B1 | 9/2016 | Chang et al. |
| 2003/0020125 | A1 | 1/2003 | Mandelman et al. |
| 2012/0052666 | A1 | 3/2012 | Choi |
| 2014/0057427 | A1 | 2/2014 | Kim et al. |
| 2015/0021694 | A1 | 1/2015 | Trevino et al. |
| 2016/0225877 | A1 | 8/2016 | Wang |
| 2020/0098890 | A1 | 3/2020 | Wu et al. |
| 2020/0251573 | A1 | 8/2020 | Jeong et al. |

REPLACEMENT GATE METHODS THAT INCLUDE TREATING SPACERS TO WIDEN GATE

PRIORITY CLAIM AND CROSS-REFERENCE

This application is a continuation of U.S. patent application Ser. No. 17/377,839 filed on Jul. 16, 2021, now U.S. Pat. No. 11,908,695 issued Feb. 20, 2024, which is a divisional of U.S. patent application Ser. No. 16/460,363 filed on Jul. 2, 2019, now U.S. Pat. No. 11,069,531 issued Jul. 20, 2021, which claims priority to U.S. Provisional Application No. 62/753,166, filed on Oct. 31, 2018, each is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
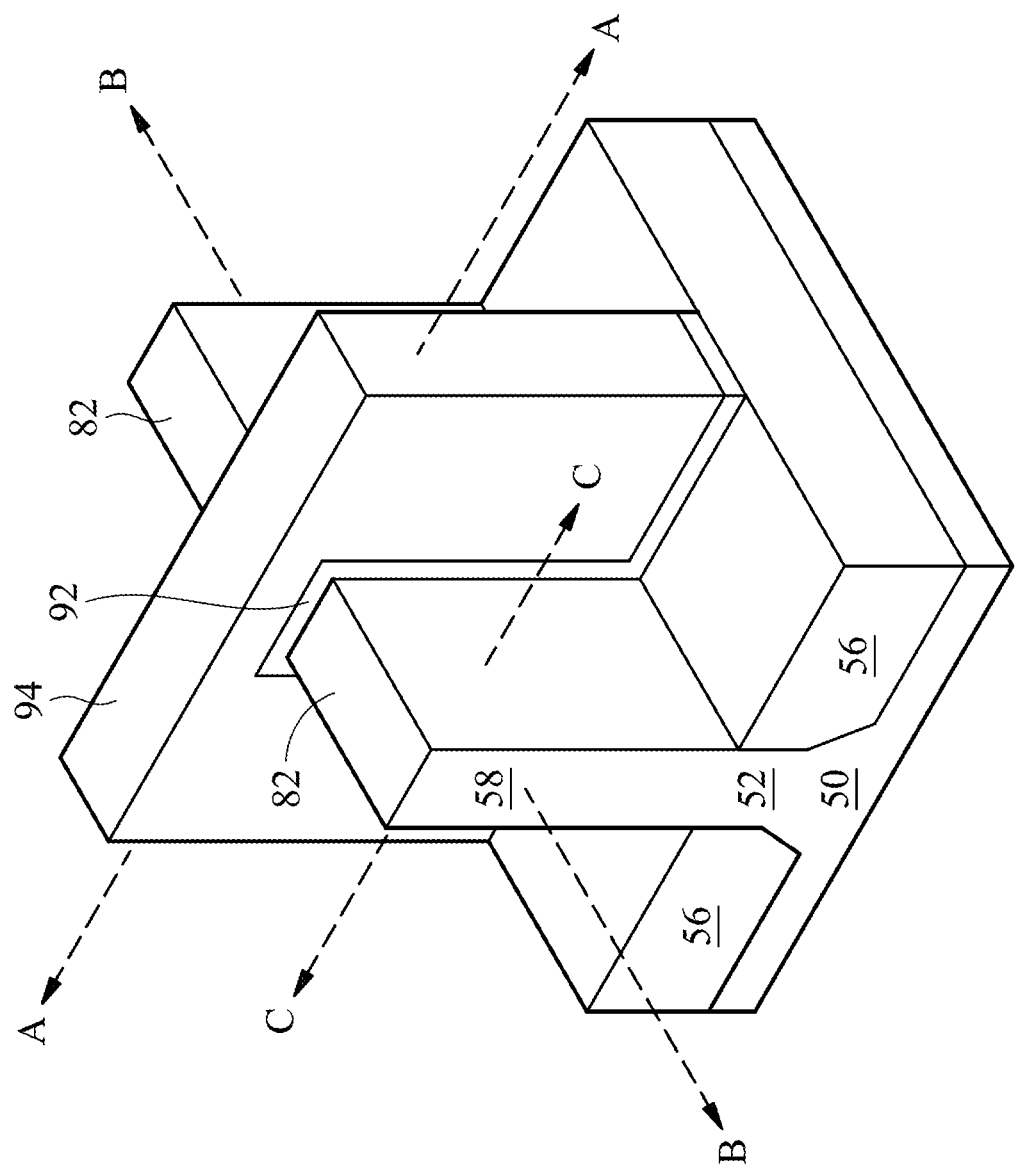
FIG. 1 is a perspective view of a fin field effect transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a semiconductor device and methods of forming a semiconductor device. In some embodiments, a dummy gate is formed, and a spacer is formed along sidewalls of the dummy gate. The dummy gate is removed, thereby forming a gate cavity having sidewalls that are defined at least by part by the spacer. A treatment is performed on portions of the exposed spacer sidewalls. In some embodiments, the treatment may include a plasma treatment. The treatment may change a material composition of the portions of the spacer. In some embodiments, for example because of the aspect ratio of the gate cavity, the treatment may penetrate more deeply into top portions of the spacer than bottom portions of the spacer. The treated portions of the spacer are then removed. Because the treatment process penetrated more deeply into the top portions of the spacer than the bottom portions of the spacer, the removal of the treated portions of the spacer may cause a larger portion of the top regions of the spacer to be removed than the bottom portions of the spacer. Accordingly, after the treated portions of the spacer are removed, a length of the gate cavity in at least a top portion of the gate cavity may be widened. Additionally, the gate cavity may have one or more tapered sidewalls. Next, a gate dielectric layer is deposited along sidewalls and a bottom surface of the gate cavity, and then the remaining portions of the gate cavity are filled by depositing one or more gate tuning layers and one or more gate electrode layers in the gate cavity.

Because of the widening of the opening in the top of the gate cavity, the filling of the gate cavity by the one or more gate dielectric layers, one or more gate tuning layers, and one or more gate electrodes may be more easily performed. For example, in some processes where a gate cavity is filled by multiple layers, such as gate dielectric layers, gate tuning layers, or gate electrode layers, when the gate cavity has a high aspect ratio the filling of the gate cavity may result in the creation of one or more voids and/or seams in the filled metal portions. A gate structure that contains one or more voids or seams may experience a degradation of performance. For example, the gate resistance of the gate structure may be increased due to the presence of one or more voids or seams. The gate structure may experience increased delay due to the presence or one or more voids or seams. In accordance with some embodiments, the widening of the gate cavity enables filling of the gate cavity to be performed with reduced voids or seams, or no voids or seams. As such, performance of the gate structure may be improved.

Various embodiments are discussed herein in a particular context, namely, forming a FinFET transistor. However, various embodiments may be applied to other semiconductor devices/processes, such as planar transistors, and the like.

FIG. 1 illustrates an example of a FinFET in a three-dimensional view, in accordance with some embodiments. The FinFET comprises a fin 58 on a substrate 50 (e.g., a semiconductor substrate). Isolation regions 56 are disposed on the substrate 50, and the fin 58 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. A gate dielectric layer 92 is along sidewalls and over a top surface of the fin 58, and a gate electrode 94 is over the gate dielectric layer 92. Source/drain regions 82 are disposed in opposite sides of the fin 58 with respect to the gate dielectric layer 92 and gate electrode 94.

FIG. 1 further illustrates reference cross-sections that are used in later figures. Cross-section A-A is along a longitudinal axis of the gate electrode 94 and in a direction, for example perpendicular to the direction of current flow between the source/drain regions 82 of the FinFET. Cross-section B-B is perpendicular to cross-section A-A and is along a longitudinal axis of the fin 58 and in a direction of, for example, a current flow between the source/drain regions 82 of the FinFET. Cross-section C—C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 19A-B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. In FIGS. 8A-B through 19A-B, figures ending with an "A" designation are illustrated along reference cross-section A-A illustrated in FIG. 1, and figures ending with a "B" designation are illustrated along a similar cross-section B-B illustrated in FIG. 1, except for multiple fins/FinFETs. FIGS. 10C, 10D, and 11C are illustrated along reference cross-section C-C illustrated in FIG. 1, except for multiple fins/FinFETs.

Figure 2:
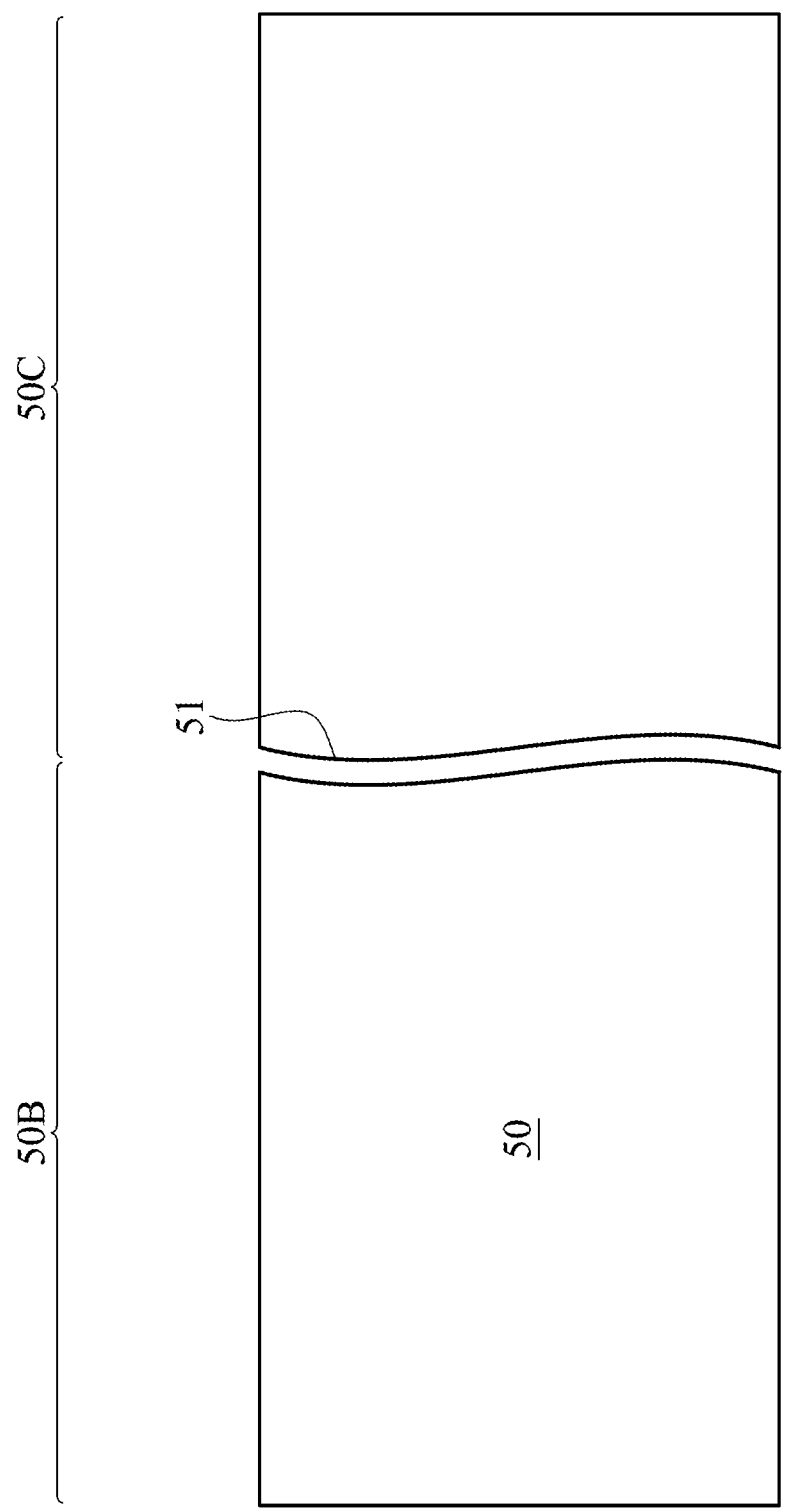
FIGS. 2-7, 8A, 8B, 9A, 9B, 10A, 10B, 10C, 10D, 11A, 11B, 11C, 12A, 12B, 13A, and 13B are cross sectional views of intermediate stages of the manufacture of a FinFET device in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50B and a region 50C. The region 50B can be for forming n-type devices, such as NMOS transistors, e.g., n-type FinFETs. The region 50C can be for forming p-type devices, such as PMOS transistors, e.g., p-type FinFETs. The region 50B may be physically separated from the region 50C (as illustrated by divider 51), and any number of device features (e.g., other active devices, doped regions, isolation structures, etc.) may be disposed between the region 50B and the region 50C. In some embodiments, both the region 50B and the region 50C are used to form the same type of devices, such as both regions being for n-type devices or p-type devices.

Figure 3:
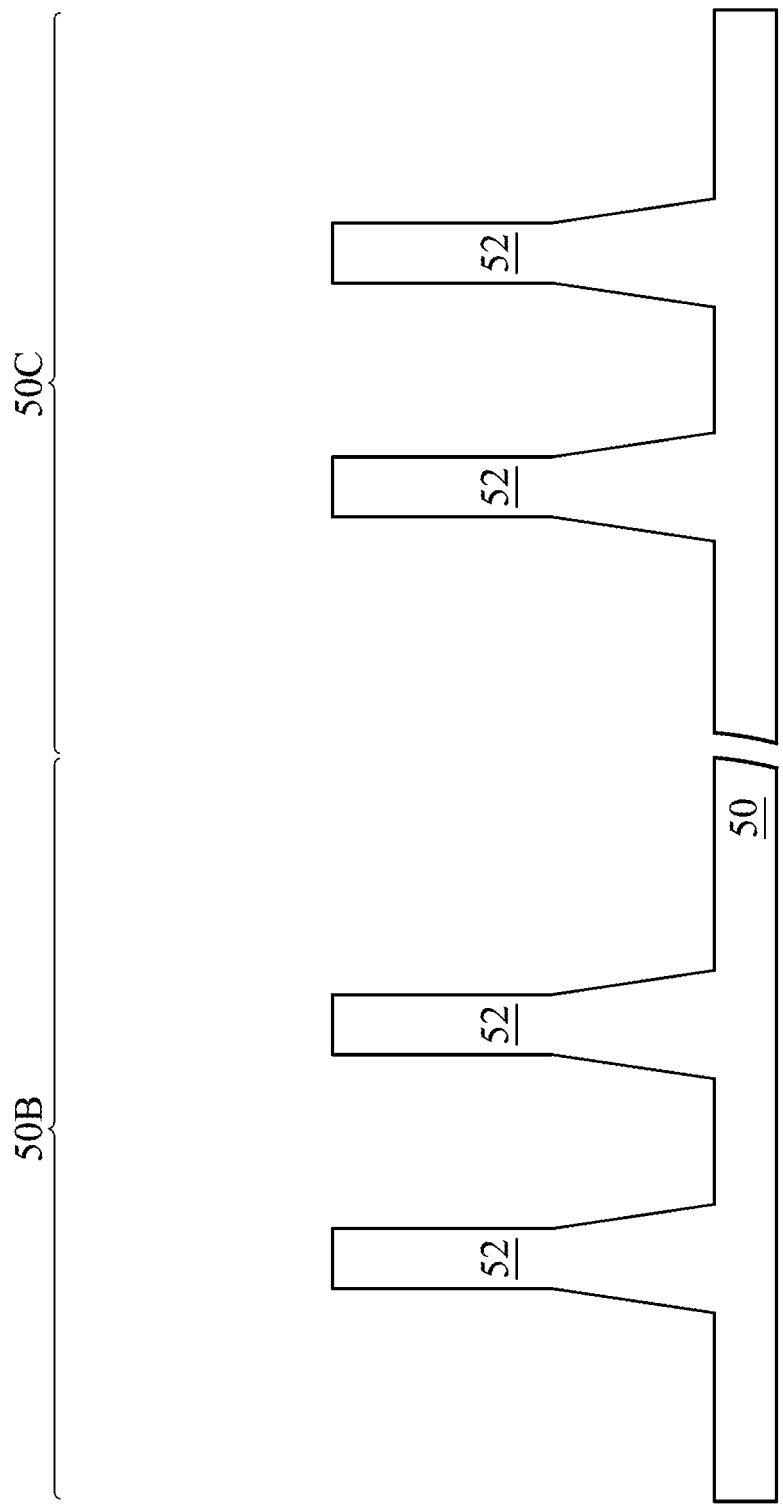

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 52.

Figure 4:
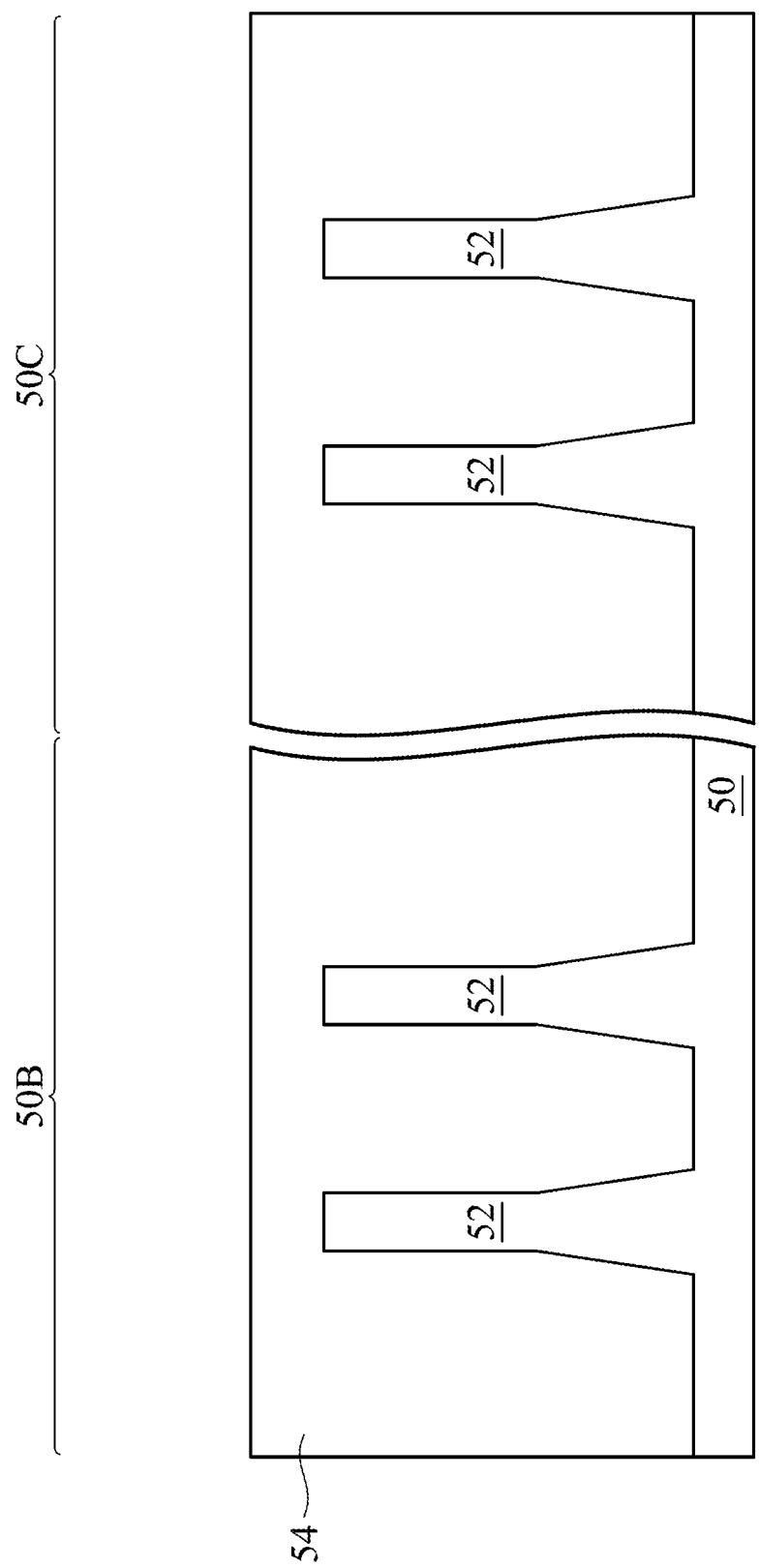

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD), or a combination thereof. Other insulation materials formed by any acceptable process may be used. In the illustrated embodiment, the insulation material 54 is silicon oxide formed by a FCVD process. In an embodiment, the insulation material 54 is formed such that excess insulation material 54 covers the fins 52.

Figure 5:
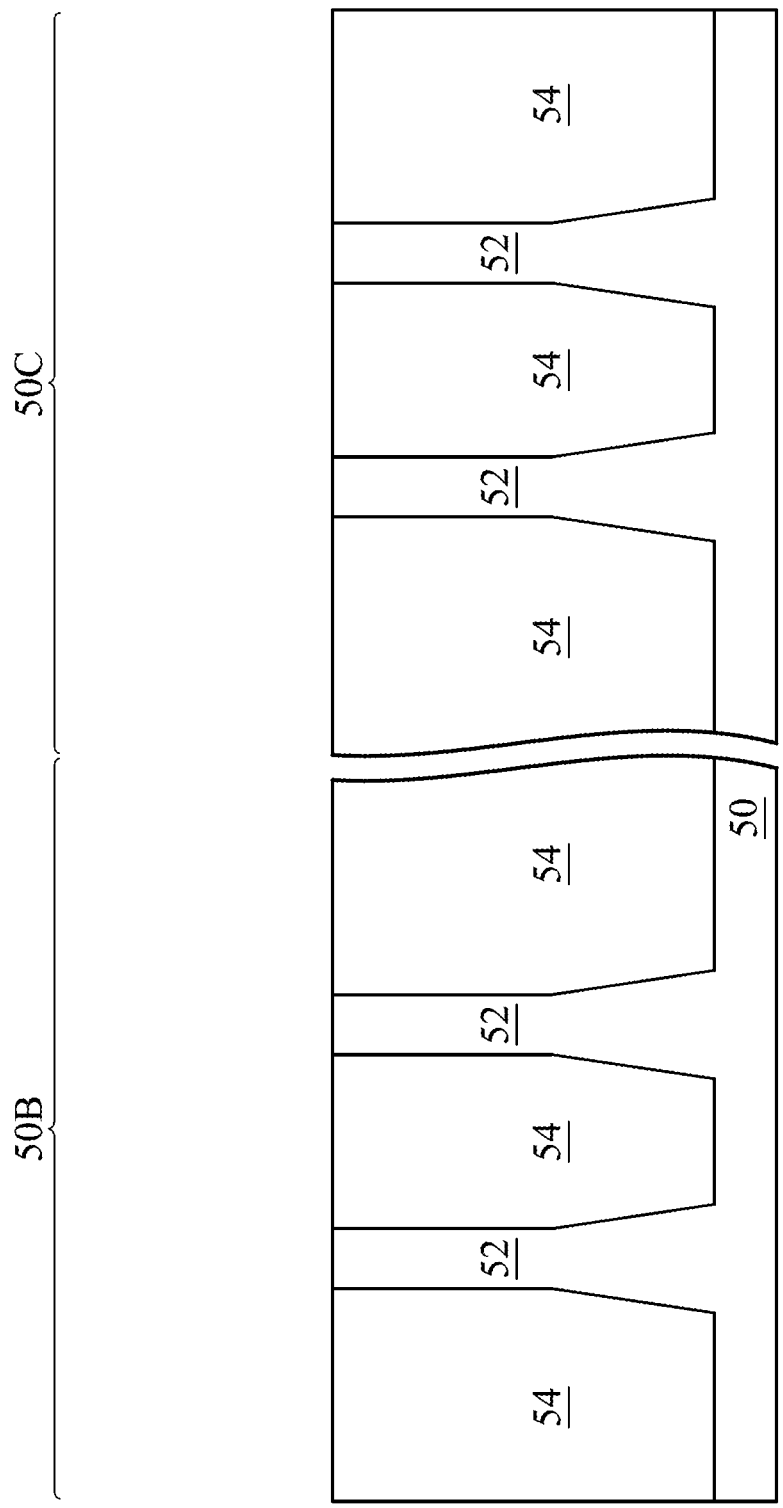

In FIG. 5, a planarization process is applied to the insulation material 54. In some embodiments, the planarization process includes a chemical mechanical polish (CMP), an etch back process, combinations thereof, or the like. The planarization process may expose the fins 52. In embodiments in which the planarization processes exposes the fins 52, top surfaces of the fins 52 and the insulation material 54 may be level after the planarization process is complete. In some other embodiments, a metal pad (not shown) and/or a mask layer (not shown) may be disposed along the top surfaces of fins 52. In this case, the planarization process may expose the metal pad or the mask layer, and after the planarization process is complete the insulation material 54 may be level with the top surfaces of the metal pad or the mask layer.

Figure 6:
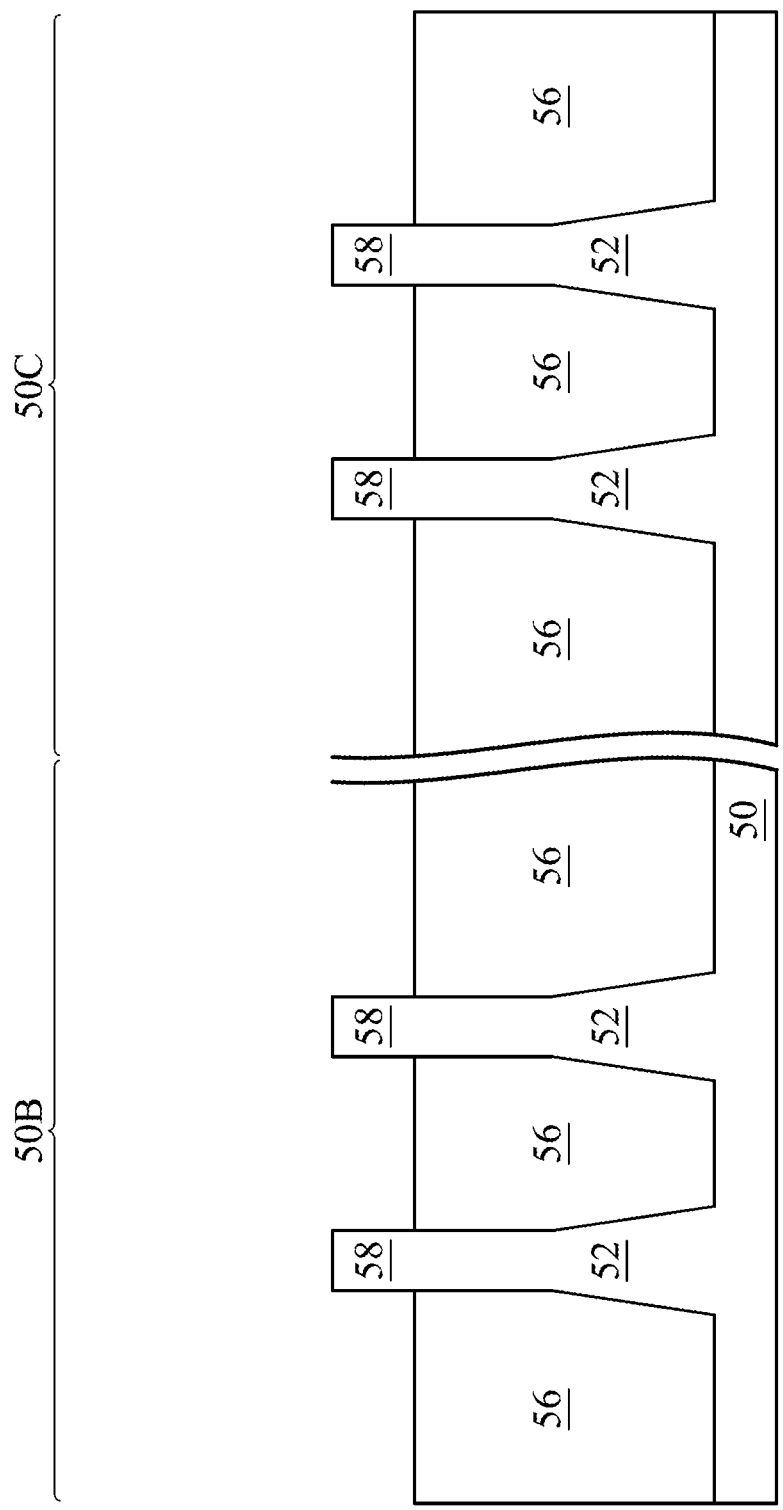

In FIG. 6, the insulation material 54 is recessed to form Shallow Trench Isolation (STI) regions 56. The insulation material 54 is recessed such that fins 58 in the region 50B and in the region 50C protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54. For example, a chemical oxide removal using a CERTAS® etch or an Applied Materials SICONI tool or dilute hydrofluoric (dHF) acid may be used.

Further in FIG. 6, appropriate wells (not shown) may be formed in the fins 58, the fins 52, and/or the substrate 50. In some embodiments, a P well may be formed in the region 50B, and an N well may be formed in the region 50C. In some embodiments, a P well or an N well are formed in both the region 50B and the region 50C.

In the embodiments with different well types, the different implant steps for the region 50B and the region 50C may be achieved using a photoresist or other masks (not shown). For example, a photoresist may be formed over the fins 58 and the STI regions 56 in the region 50B. The photoresist is patterned to expose the region 50C of the substrate 50, such as a PMOS region. The photoresist can be formed by using a spin-on technique and can be patterned using acceptable photolithography techniques. Once the photoresist is patterned, an n-type impurity implant is performed in the region 50C, and the photoresist may act as a mask to substantially prevent n-type impurities from being implanted into the region 50B, such as an NMOS region. The n-type impurities may be phosphorus, arsenic, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the region 50C, a photoresist is formed over the fins 58 and the STI regions 56 in the region 50C. The photoresist is patterned to expose the region 50B of the substrate 50, such as the NMOS region. The photoresist can be formed by using a spin-on technique and can be patterned using acceptable photolithography techniques. Once the photoresist is patterned, a p-type impurity implant may be performed in the region 50B, and the photoresist may act as a mask to substantially prevent p-type impurities from being implanted into the region 50C, such as the PMOS region. The p-type impurities may be boron, BF$_2$, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the region 50B and the region 50C, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
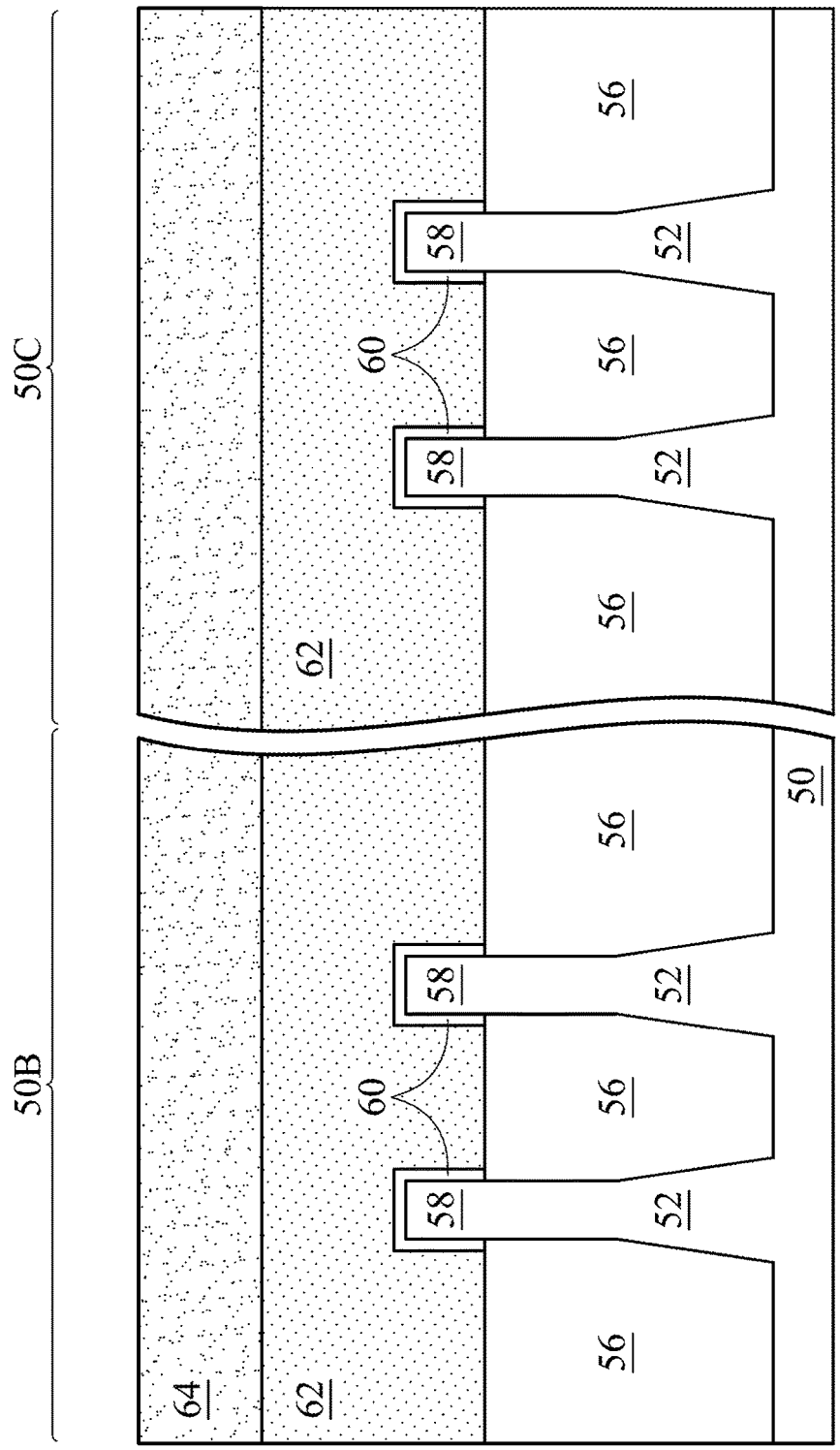

In FIG. 7, a dummy dielectric layer 60 is formed on the fins 58. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP process. The mask layer 64 may be deposited over the dummy gate layer 62. The dummy gate layer 62 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50B and the region 50C. In some embodiments, separate dummy gate layers may be formed in the region 50B and the region 50C, and separate mask layers may be formed in the region 50B and the region 50C.

FIGS. 8A-B through 19A-B illustrate various additional steps in the manufacturing of embodiment devices. FIGS. 8A-B through 19A-B illustrate features in either of the region 50B and the region 50C. For example, the structures illustrated in 8A-B through 19A-B may be applicable to both the region 50B and the region 50C. Differences (if any) in the structures of the region 50B and the region 50C are described in the text accompanying each figure.

Figure 8B:
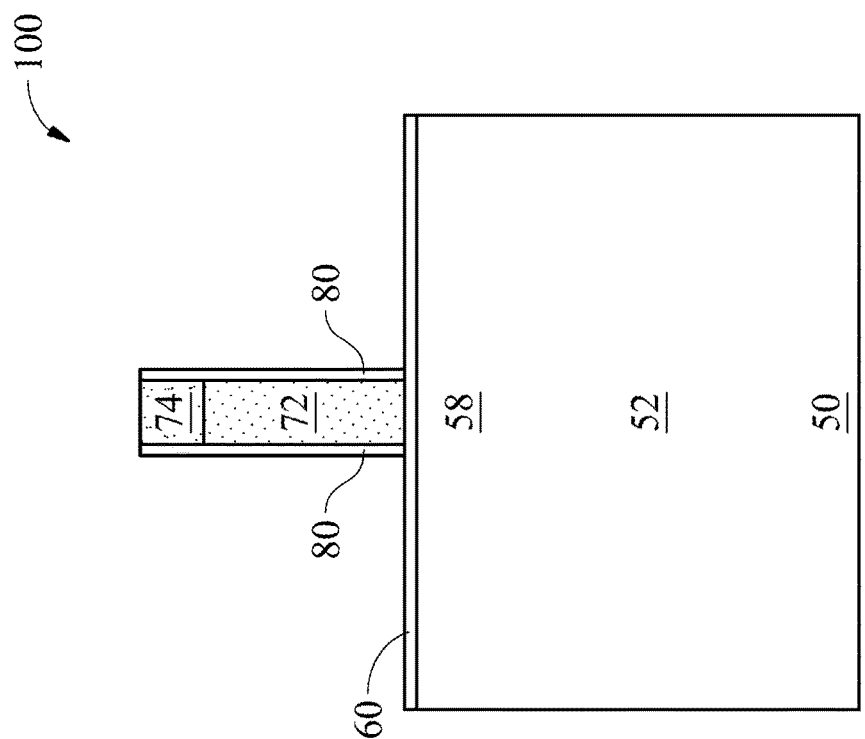
Figure 8A:
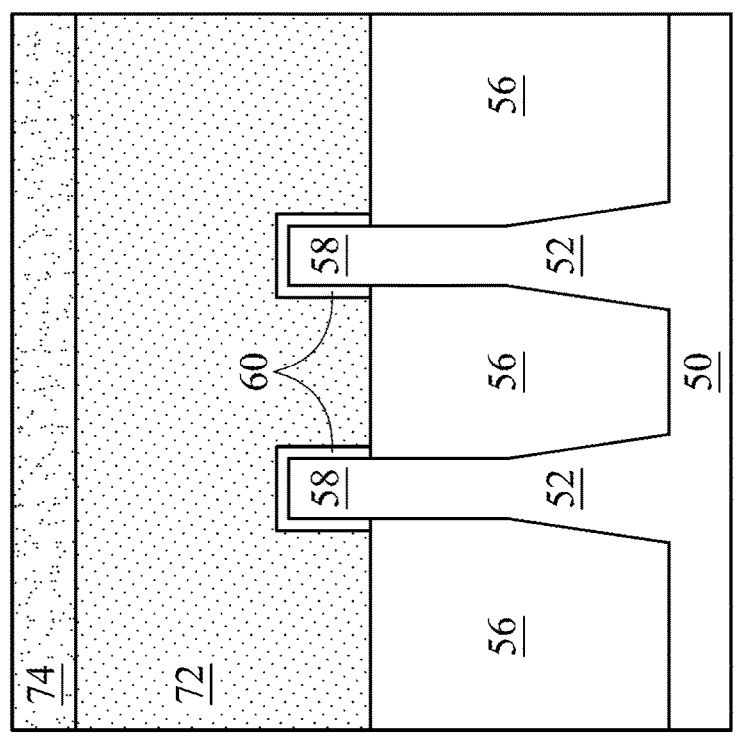

In FIGS. 8A and 8B, the mask layer 64 may be patterned using acceptable photolithography and etching techniques to form masks 74. The pattern of the masks 74 then may be transferred to the dummy gate layer 62 and the dummy dielectric layer 60 by an acceptable etching technique to form dummy gates 72. The dummy gates 72 cover respective channel regions of the fins 58. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52/58.

Further in FIGS. 8A and 8B, gate seal spacers 80 can be formed on the dummy gate 72, the mask 74, and the fins 58. A thermal oxidation or a deposition followed by an anisotropic etch may form the gate seal spacers 80.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50B, while exposing the region 50C, and appropriate type (e.g., n-type or p-type) impurities may be implanted into the exposed fins 58 in the region 50C. The mask may then be removed. Subsequently, a mask, such as a photoresist, may be formed over the region 50C while exposing the region 50B, and appropriate type impurities may be implanted into the exposed fins 58 in the region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 9B:
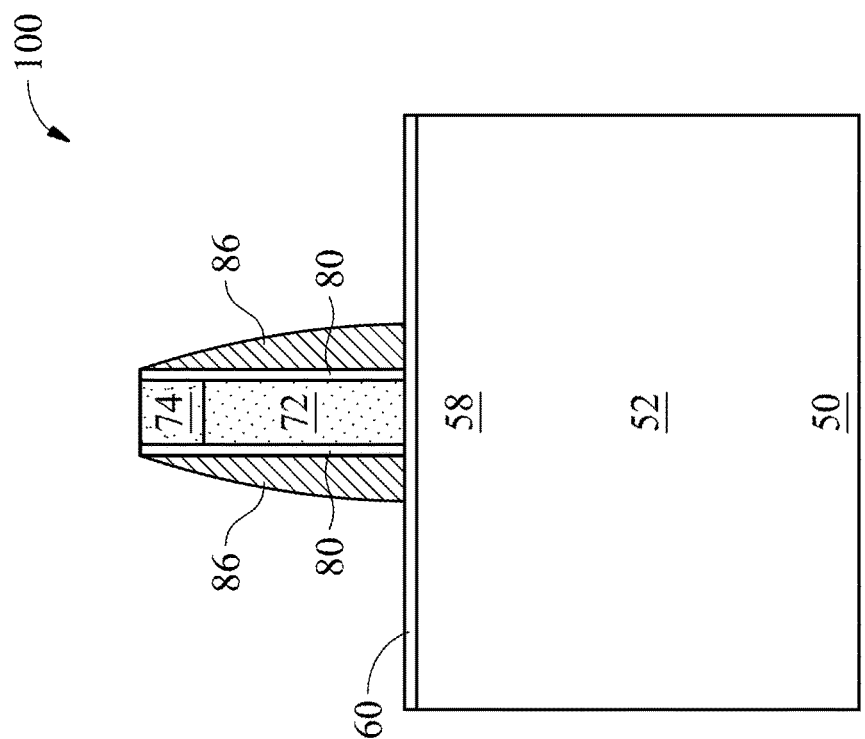
Figure 9A:
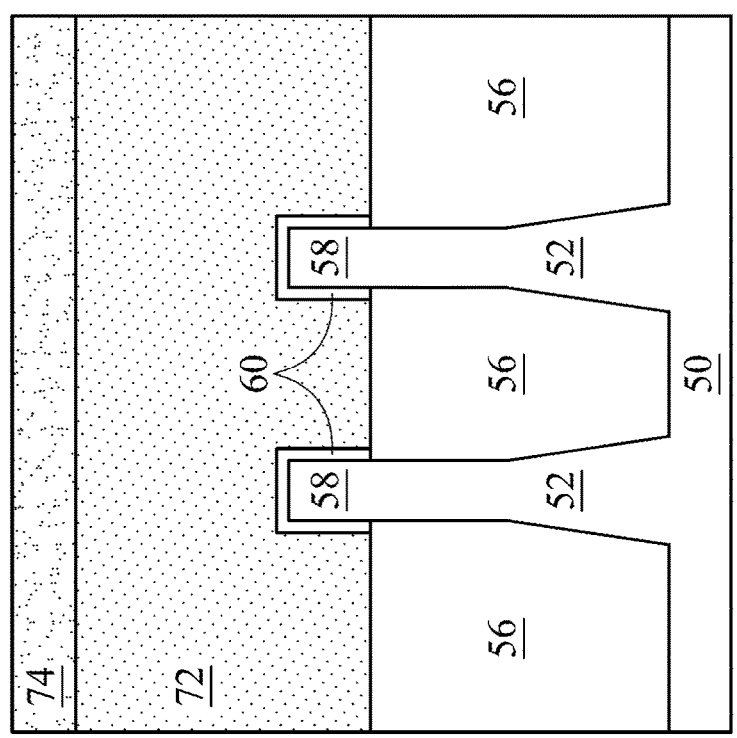
Figure 10B:
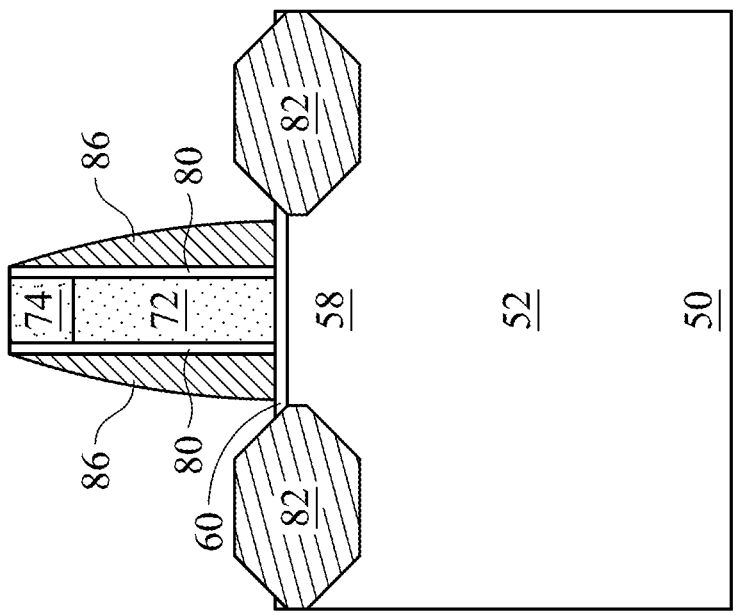
Figure 10A:
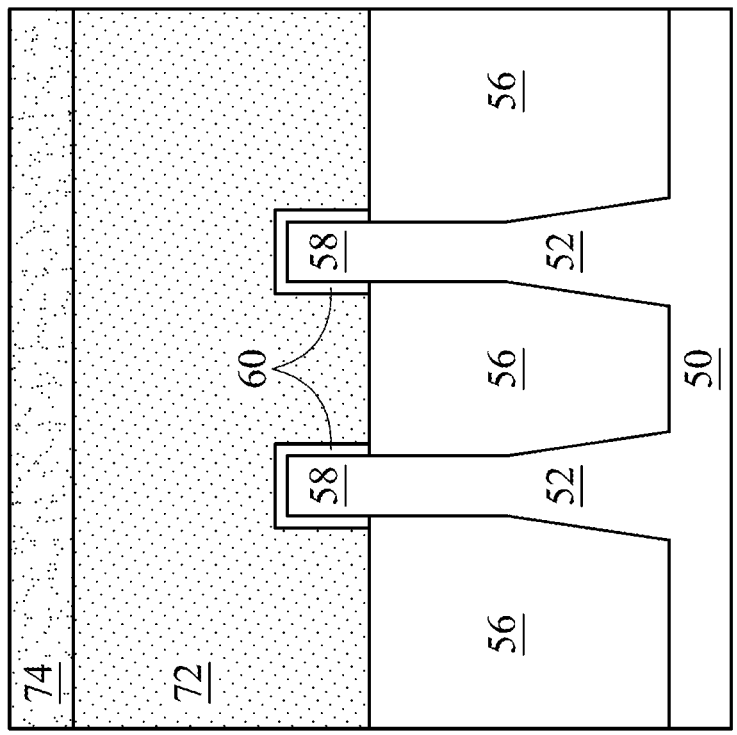
Figure 10C:
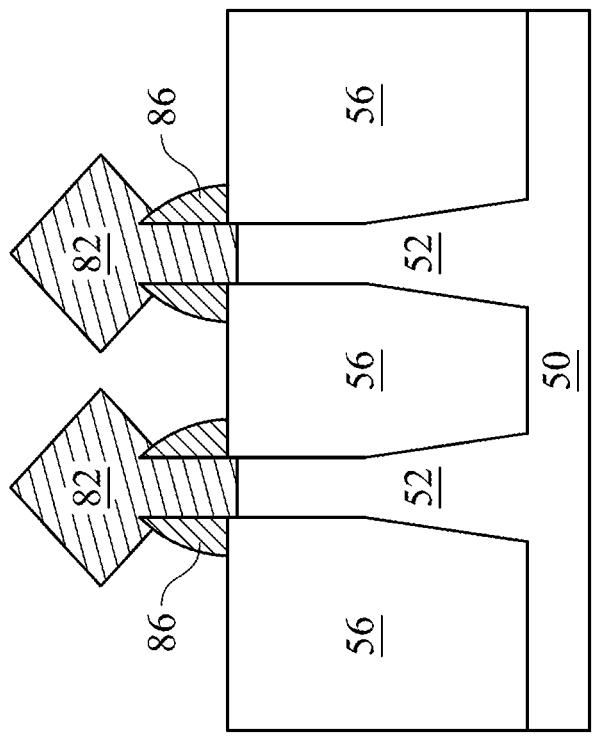
Figure 10D:
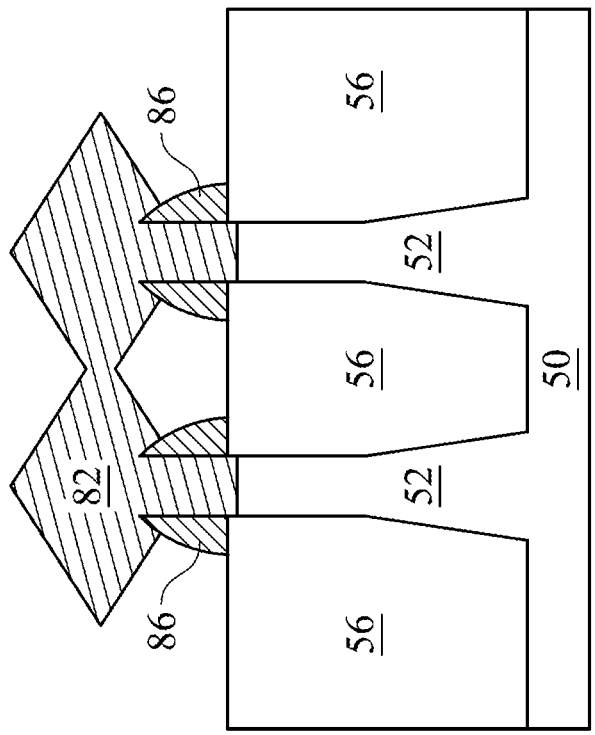

In FIGS. 9A and 9B, gate spacers 86 are formed on the gate seal spacers 80 along sidewalls of the dummy gates 72 and the masks 74. The gate spacers 86 may be formed by conformally depositing a material and subsequently anisotropically etching the material. The material of the gate spacers 86 may be silicon nitride, SiCN, a combination thereof, or the like.

In FIGS. 10a-10D epitaxial source/drain regions 82 are formed in the fins 58. The epitaxial source/drain regions 82 are formed in the fins 58 such that each dummy gate 72 is disposed between respective neighboring pairs of the epitaxial source/drain regions 82. In some embodiments epitaxial source/drain regions 82 may extend into the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50B, e.g., the NMOS region, may be formed by masking the region 50C, e.g., the PMOS region, and etching source/drain regions of the fins 58 in the region 50B form recesses in the fins 58. Then, the epitaxial source/drain regions 82 in the region 50B are epitaxially grown in the recesses. The epitaxial source/drain regions 82 may include any acceptable material, such as appropriate for n-type FinFETs. For example, if the fin 58 is silicon, the epitaxial source/drain regions 82 in the region 50B may include silicon, SiC, SiCP, SiP, or the like. The epitaxial source/drain regions 82 in the region 50B may have surfaces raised from respective surfaces of the fins 58 and may have facets.

The epitaxial source/drain regions 82 in the region 50C, e.g., the PMOS region, may be formed by masking the region 50B, e.g., the NMOS region, and etching source/drain regions of the fins 58 in the region 50C are etched to form recesses in the fins 58. Then, the epitaxial source/drain regions 82 in the region 50C are epitaxially grown in the recesses. The epitaxial source/drain regions 82 may include any acceptable material, such as appropriate for p-type FinFETs. For example, if the fin 58 is silicon, the epitaxial source/drain regions 82 in the region 50C may comprise SiGe, SiGeB, Ge, GeSn, or the like. The epitaxial source/drain regions 82 in the region 50C may also have surfaces raised from respective surfaces of the fins 58 and may have facets.

The epitaxial source/drain regions 82 and/or the fins 58 may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50B and the region 50C, upper surfaces of the epitaxial source/drain regions have facets which expand laterally outward beyond a sidewalls of the fins 58. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D.

Figure 11B:
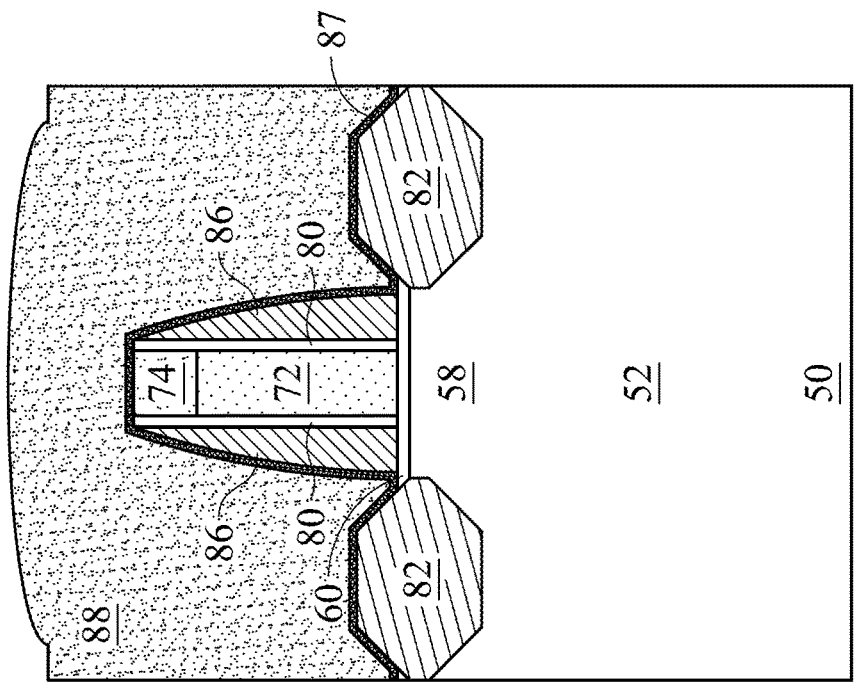
Figure 11A:
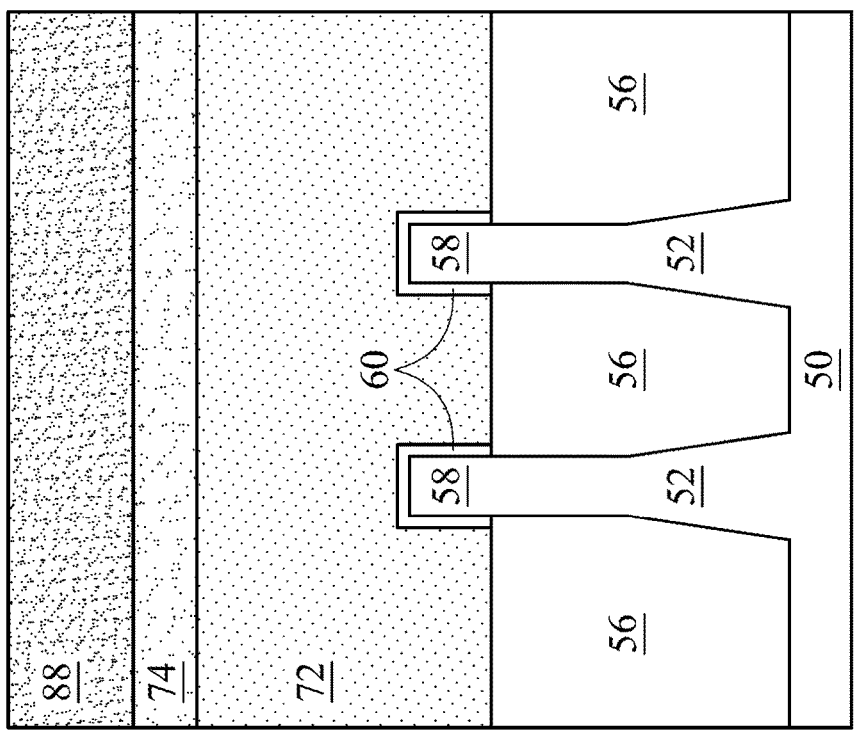
Figure 11C:
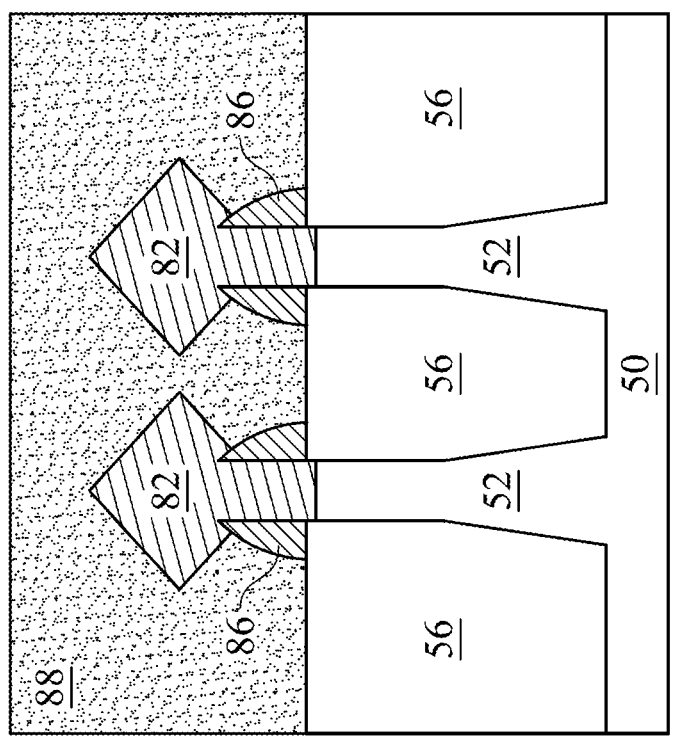

In FIGS. 11A, 11B, and 11C, an interlayer dielectric (ILD) 88 is deposited over the structure illustrated in FIGS. 10a-10D. The ILD 88 may be formed of a dielectric material or a semiconductor material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous silicon, silicon germanium ($Si_xGe_{1-x}$, where x can be between approximately 0 and 1), pure Germanium, or the like. In some embodiments oxide or nitride films may be used. Other insulation or semiconductor materials formed by any acceptable process may be used. In some embodiments, a contact etch stop layer (CESL) 87 is disposed between the ILD 88 and the epitaxial source/drain regions 82, the hard mask 74, and the gate spacers 86. The CESL 87 may comprise a dielectric material, such as, silicon nitride, silicon oxide, silicon ox nitride, or the like.

Figure 12B:
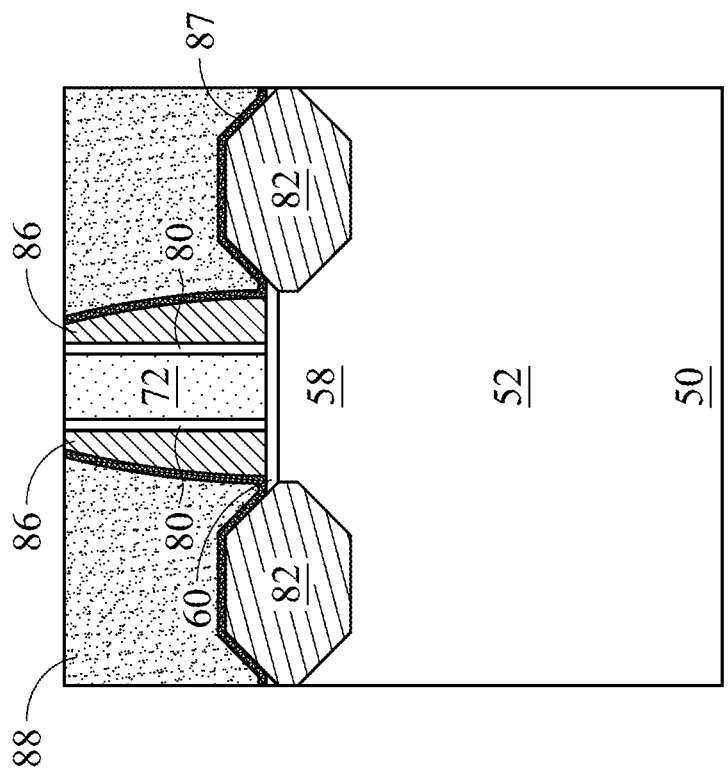
Figure 12A:
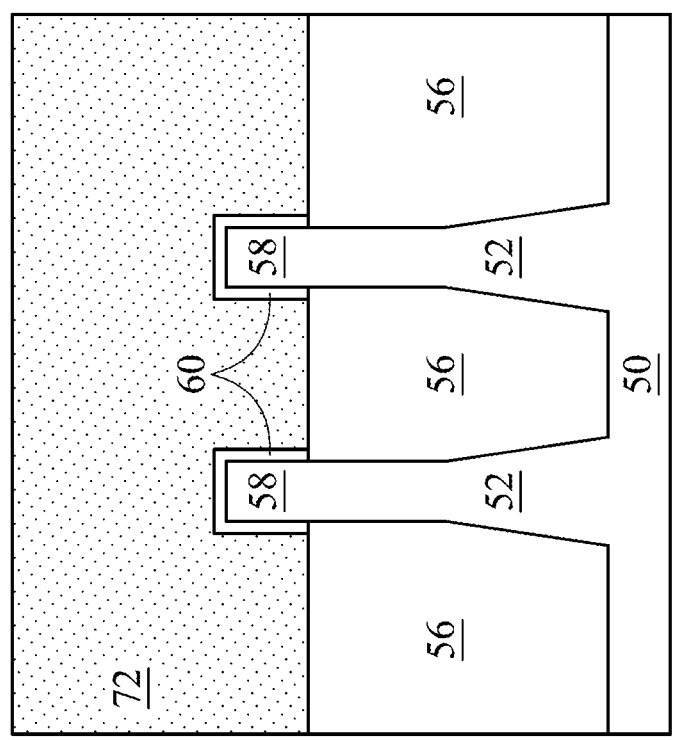

In FIGS. 12A and 12B, a planarization process, such as a CMP, may be performed to level the top surface of the ILD 88 with the top surfaces of the dummy gates 72. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the ILD 88 are level. Accordingly, the top surfaces of the dummy gates 72 are exposed through the ILD 88.

Figure 13B:
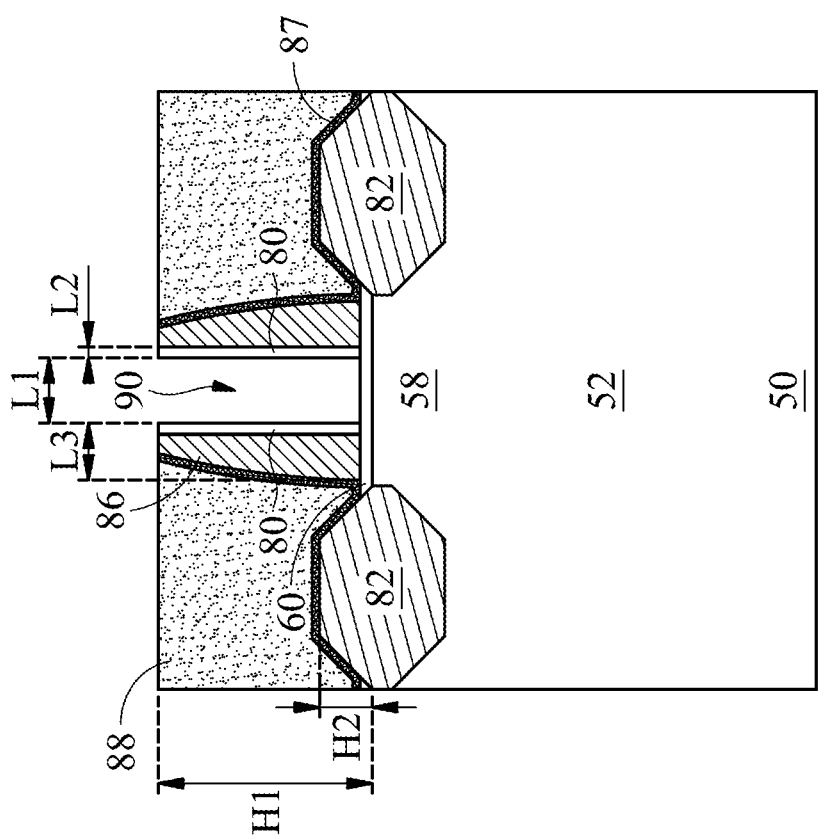
Figure 13A:
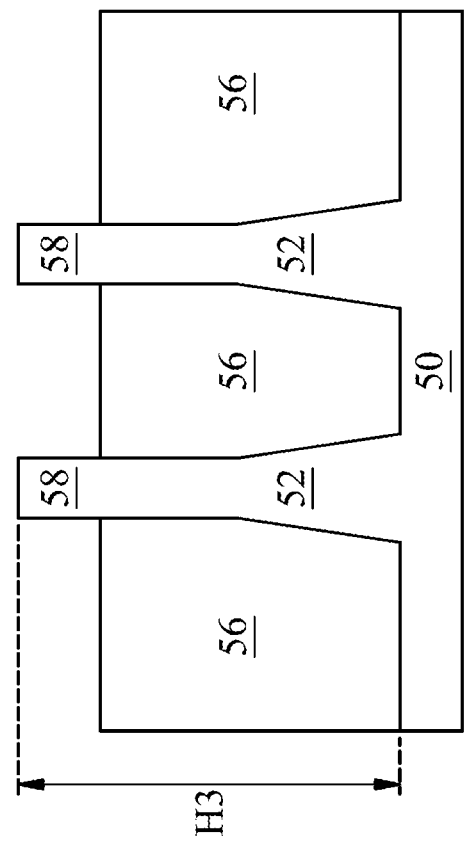

In FIGS. 13A and 13B, the dummy gates 72 are removed in an etching step(s), so that gate cavities 90 are formed. In some embodiments, the dummy gates 72 are removed by an anisotropic dry etch process. For example, the etching process may include a dry etch process using reaction gas(es) that selectively etch the dummy gates 72 without etching the ILD 88, the gate seal spacers 80, or gate spacers 86. Each gate cavity 90 exposes an upper surface of dummy dielectric layer 60. During the removal, the dummy dielectric layer 60 may be used as an etch stop layer when the dummy gates 72 are etched. As shown in FIGS. 13A and 13B, sidewalls of gate cavities 90 are defined by gate seal spacers 80.

In some embodiments, a gate height H1 may be about 30 nm to about 100 nm. A height H2 of a top surface of the fins 58 compared to a top surface of the epitaxial source/drain regions 82 may be about −15 nm to about +15 nm in some embodiments. A height H3 of the fins 58 over the substrate 50 may be about 20 nm to about 50 nm in some embodiments. A length L1 of the gate cavity 90 may be about 4 nm to about 24 nm. A length L2 of gate seal spacer 80 may be about 15 nm to about 35 nm in some embodiments. A length L3 of gate spacer 86 may be about 15 nm to about 35 nm in some embodiments.

As will be described below in connection with FIGS. 16A-B, in subsequent processing the gate cavities 90 will be filled to form a gate structure. In the manufacture of some FinFET devices, the filling of gate cavities 90 may create one or more voids or seams in the gate structure. For example, in some FinFET devices it may be desirable to reduce a length of the gate structure. A reduction of the length of the gate structure may cause the gate cavities 90 to have a high aspect ratio, which in some cases may contribute to the formation of a seam or a void in the gate structure. For example, in some embodiments a gate cavity 90 that is manufactured according to the dimensions discussed in connection with FIGS. 13A and 13B may have an aspect ratio in which the filling of the gate cavity 90 may cause one or more voids and/or seams to be created in the filled gate cavity 90. The seams and/or voids created in the gate structure may cause a reduction in the performance of the FinFET device. For example, the seam or void may increase the gate resistance and/or cause delays in the electrical performance of the FinFET device.

In accordance with some embodiments, a treatment may be applied to at least some portions of gate seal spacers 80. In subsequent processing, the treated portions of gate seal spacers 80 may be removed. The treatment and removal of portions of gate seal spacers may change the profile of the gate cavities 90, for example to widen the opening of the gate cavities 90 through which the gate cavities 90 will be filled. In some embodiments, the gate cavities 90 having the widened openings may be filled with reduced seams or voids, and in some embodiments may be filled with no seams or voids. Accordingly, performance of the FinFET device may be improved.

Figure 14:
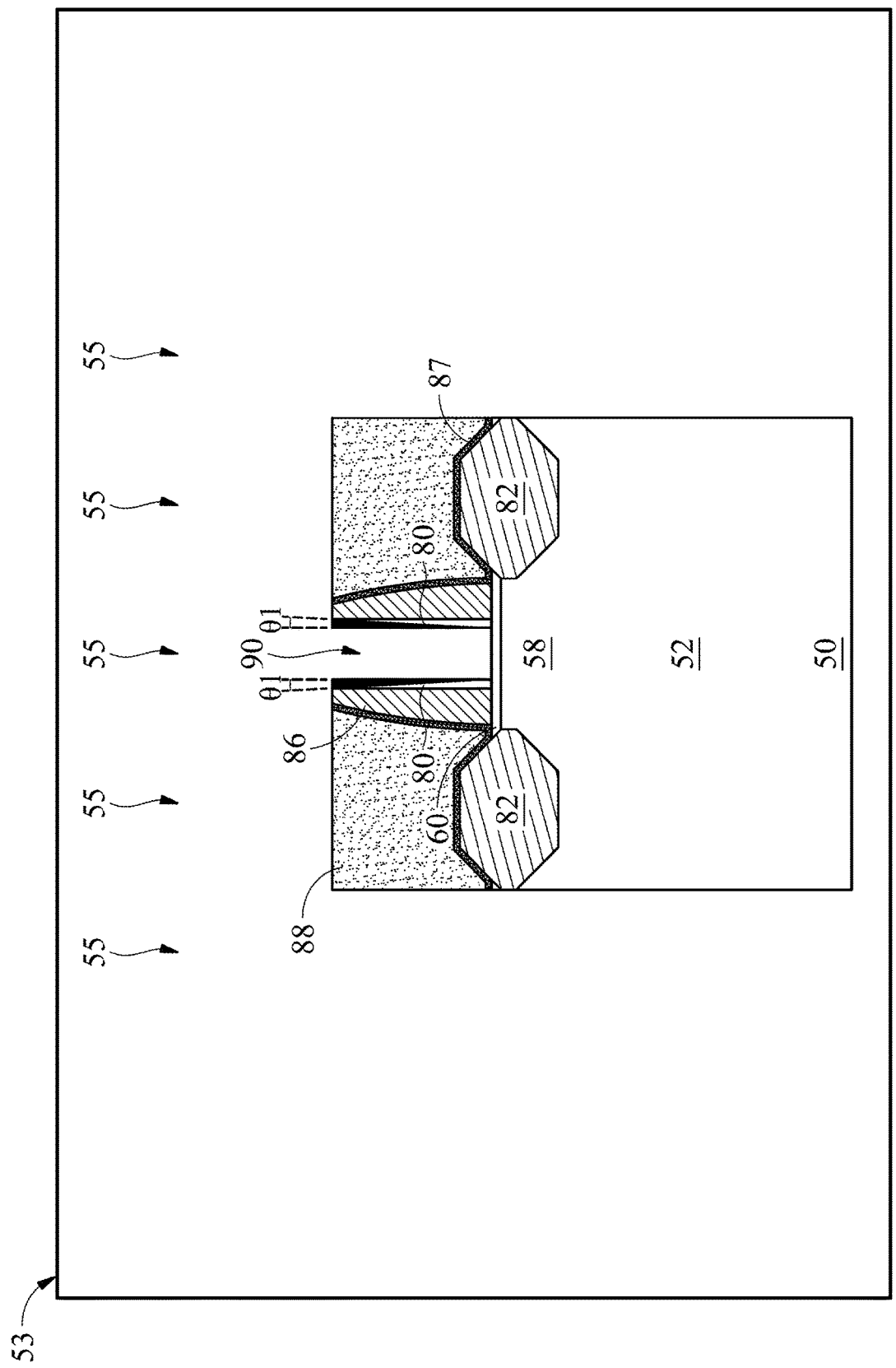
FIG. 14 is an illustration of a treatment process of a FinFET device in an intermediate stage of the manufacture of the FinFET device in accordance with some embodiments.

FIG. 14 depicts a treatment 55 that is applied to gate seal spacers 80. In some embodiments, the FinFET devices being manufactured are placed in a process chamber 53 for the treatment 55. Treatment 55 may be a plasma treatment. In some embodiments treatment 55 may include an inductively coupled plasma (ICP) treatment. For example, a plasma may be introduced into the treatment chamber 53, a desired electrical power may be applied to the process chamber 53, and a desired pressure may be created in the process chamber 53, causing the plasma to react with the portions of the gate seal spacers 80. In some embodiments, for example because of the aspect ratio of the gate cavities 90, the plasma may not penetrate to the bottom of the gate cavities 90, or may only penetrate to the bottom of the gate cavities 90 in a small concentration. During the treatment 55, a concentration of plasma in the gate cavities 90 may vary according to height of the gate cavities 90. Accordingly, a penetration distance of the plasma into the gate seal spacers 80 may vary according to height of the gate seal spacers 80.

The plasma may be formed of a gas in some embodiments. For example, a combination of oxygen gas ($O_2$) and a noble gas (for example nitrogen gas ($N_2$), helium gas (He), neon gas (Ne), argon gas (Ar), krypton gas (Kr), or xenon gas (Xe)) may be used in some embodiments to form the plasma for the treatment 55. A ratio of oxygen gas to the noble gas may be about 10% to about 90% in some embodiments. The desired electrical power may be about 200 Watt to 2000 Watt in some embodiments. The treatment time may be about 10 seconds to about 120 seconds in some embodiments. The desired pressure may be about 5 mTorr to about 200 mTorr in some embodiments.

As shown in FIG. 14, the treatment 55 may alter the material composition of the portions of the gate seal spacers 80. Top portions of the gate seal spacers 80 that are farthest from substrate 50 may be altered throughout the gate seal spacers 80, while the bottom portions of the gate seal spacers 80 may be only slightly altered along the surfaces of the gate seal spacers 80 that face the gate cavity 90. In some embodiments, a penetration distance of the treatment 55 into gate seal spacers 80 may change according to height within the gate cavity 90, with a greatest penetration distance being located at the top of the gate seal spacers 80 and a smallest penetration distance being located in the gate cavity 90 (for example at the bottom of the gate seal spacers 80, or a lowest point along gate seal spacers 80 at which the plasma was present in the treatment 55). In some embodiments, the variation of the penetration distance of the treatment 55 into the gate seal spacers according to height may form an angle $\theta_1$ with respect to an inner sidewall of the respective gate seal spacer 80. In some embodiments, $\theta_1$ be about 3 degrees to about 50 degrees.

As discussed above, the treatment 55 may change a material composition of the portions of the gate seal spacers 80. Before the treatment 55, the gate seal spacers 80 may comprise $Si_{1-x-y-z}O_xN_yC_z$, where x is about 45%±15%, y is about 15%±15% and z is 10%±10%. After the treatment 55, the gate seal spacers 80 may include changed portions and unchanged portions. In the changed portions in which the treatment 55 has changed the material composition of the gate seal spacers 80, the changed portion may comprise $Si_{1-x-y-z}O_xN_yC_z$, where x is about 55%±15%, y is about 10%±10% and z is 5%±5%. The unchanged portions where treatment 55 did not penetrate, the material composition of the gate seal spacers remains $Si_{1-x-y-z}O_xN_yC_z$, where x is about 45%±15%, y is about 15%±15% and z is 10%±10%, and may be the same as the material composition of the gate seal spacers 80 prior to the treatment 55.

In some embodiments, the material composition of gate spacers 86 may be unchanged by the treatment 55. For example, before the treatment 55, the gate spacers may comprise $Si_{1-x-y-z}O_xN_yC_z$, where x is about 45%±15%, y is about 15%±15% and z is 10%±10%. After the treatment 55, the gate spacers 86 may still comprise $Si_{1-x-y-z}O_xN_yC_z$, where x is about 45%±15%, y is about 15%±15% and z is 10%±10%, and the material composition may be the same.

Figure 15B:
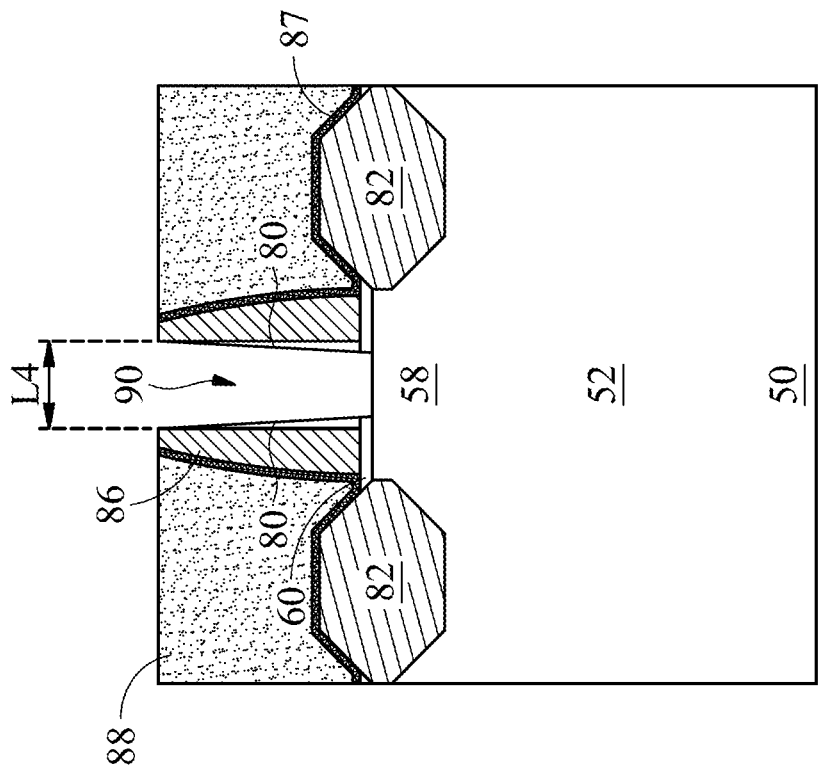
FIGS. 15A, 15B, 16A, 16B, 17A, 17B, 18A, 18B, 19A, and 19B, are cross sectional views of intermediate stages of the manufacture of a FinFET device in accordance with some embodiments.
Figure 15A:
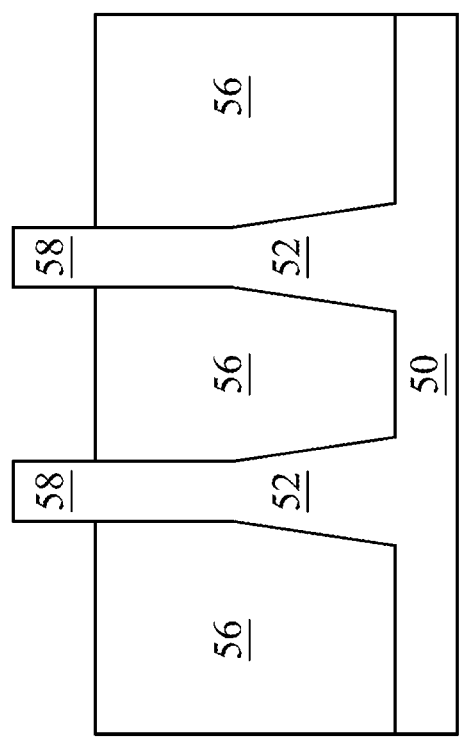

In FIGS. 15A and 15B, treated portions of the gate seal spacers 80 and the portion of the dummy dielectric layer 60 exposed in the gate cavity 90 are removed in an etching step(s). In some embodiments, the treated portions of the gate seal spacers 80 and the portion of the dummy dielectric layer 60 exposed in the gate cavity 90 are simultaneously removed by an single etch process, such as an anisotropic dry etch process. For example, the etching process may include a dry etch process using reaction gas(es) that selectively etch the treated portions of the gate seal spacers 80 and the portion of the dummy dielectric layer 60 exposed in the gate cavity 90 without etching the untreated portions of the gate seal spacers 80 or the gate spacers 86.

As shown in FIGS. 15A and 15B, the removal of the treated portions of gate seal spacer 80 has created tapered sidewalls of the gate cavity 90 that are defined by the untreated portions of the gate seal spacers 80. After the removal of the treated portions of the gate seal spacer 80, the thickness of the remaining portions of gate seal spacer 80 may vary according to height, where a thinnest portion is at the top of the gate cavity 90 and the thickest portion is further into the gate cavity 90, for example at the bottom of gate cavity 90. The gate cavity 90 may be defined in part by the gate spacers 86, for example at the top of gate cavity 90. The removal of the treated portions of the gate seal spacers 80 has caused the top opening of the gate cavity to be widened. In some embodiments, a length L4 of the top opening of the gate cavity 90 after the treatment 55 may be about 0 nm to about 6.0 nm. In some embodiments, the treatment 55 of portions of gate seal spacers 80 and subsequent removal of the treated portions of gate seal spacers 80 may increase the length of the top opening of gate cavity 90 by about 0% to about 30%.

Figure 16B:
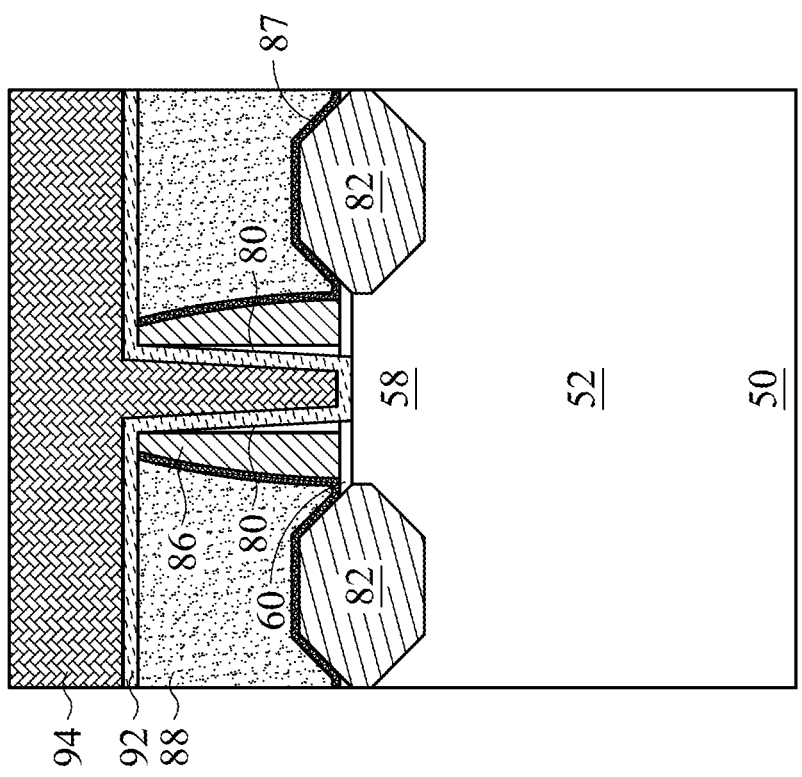
Figure 16A:
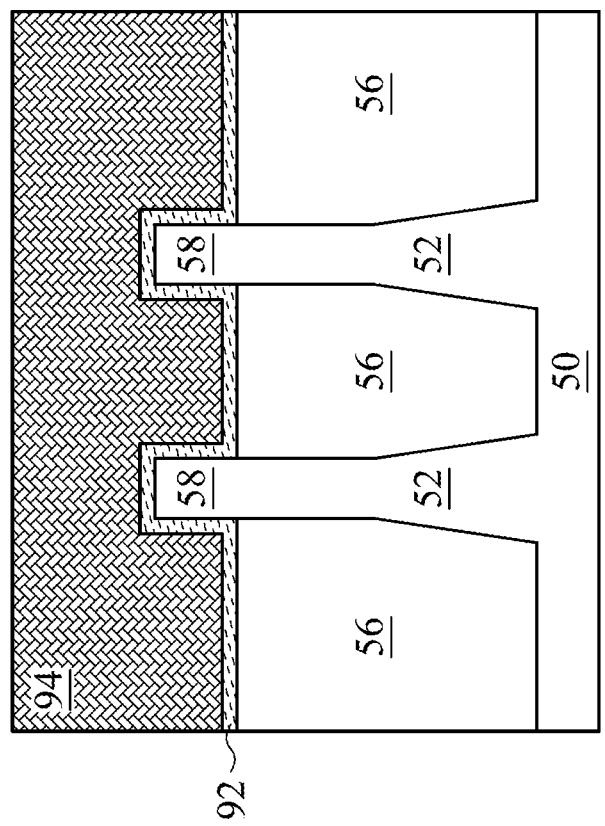

In FIGS. 16A and 16B, gate dielectric layers 92 and gate electrodes 94 are formed for replacement gates. Gate dielectric layers 92 are deposited conformally in the recesses 90, such as on the top surfaces and the sidewalls of the fins 58 and on sidewalls of the gate seal spacers 80/gate spacers 86. The gate dielectric layers 92 may also be formed on top surface of the ILD 88. In accordance with some embodiments, the gate dielectric layers 92 comprise silicon oxide, silicon nitride, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, PECVD, and the like.

The gate electrodes 94 are deposited over the gate dielectric layers 92, respectively, and fill the remaining portions of the recesses 90. The gate electrodes 94 may be a metal-containing material such as TiN, TaN, TaC, Co, Ru, Al, combinations thereof, or multi-layers thereof. For example, although a single gate electrode 94 is illustrated, any number of work function tuning layers may be deposited in the recesses 90.

The formation of the gate dielectric layers 92 in the region 50B and the region 50C may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and the gate electrodes 94 in each region may be formed by distinct processes, such that the gate electrodes 94 may be different materials. Various masking steps may be used to mask and expose appropriate regions when using distinct processes.

Figure 17B:
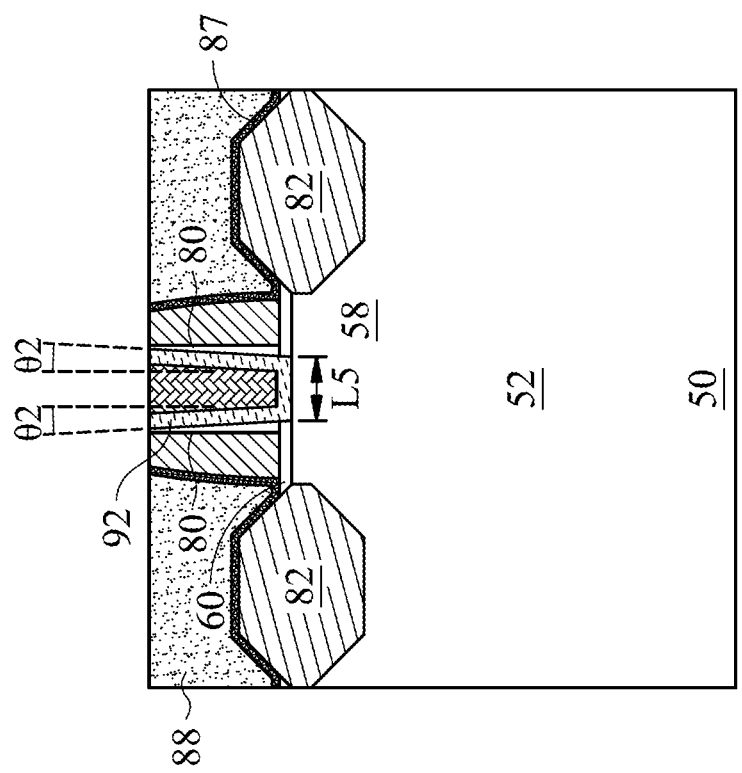
Figure 17A:
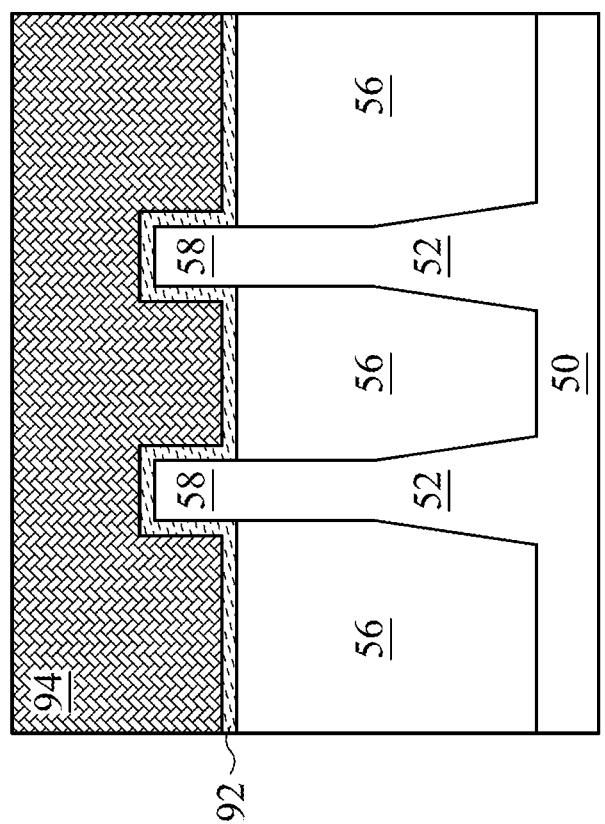

In FIGS. 17A and 17B, a planarization process, such as a CMP, may be performed to remove the excess portions of the gate dielectric layers 92 and the material of the gate electrodes 94, which are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate," a "gate stack," or a "gate structure." The gate structure may extend along sidewalls of a channel region of the fins 58.

The planarization process may continue until a height H4 of the gate structure over the fin 58 is a desired height. In some embodiments, the desired height H4 is about 10 nm to about 30 nm. After the planarization process, the gate structure may comprise tapered sidewalls. For example, the gate dielectric layers 92 and the gate electrodes 94 may comprise tapered sidewalls. As shown in FIG. 17B, the tapered sidewalls may form an angle $\theta^2$ with respect to a direction that is perpendicular to a major surface of substrate 50. In some embodiments, $\theta^2$ is about 3 degrees to about 50 degrees. In some embodiments, $\theta^2$ is about the same as $\theta^1$ (discussed above in connection with FIG. 14). A gate length L5 of the gate structure along the bottom surface of the gate structure that is closest to the fin 58 may be substantially the same as the length L1 of the gate cavity 90 (shown in FIG. 13B). For example, the gate length L5 of the gate structure along the bottom surface of the gate structure may be about 4 nm to about 24 nm.

In some embodiments, the widening of the top opening of gate cavity 90 may allow the gate dielectric layers 92 and/or the gate electrodes 94 to be more easily deposited in the gate cavity 90. For example, in some embodiments the gate dielectric layers 92 and/or the gate electrodes 94 may be deposited with less voids or seams, or no voids or seams. Accordingly, the resistance of the gate structure may be reduced, and/or performance of the FinFET device may be improved. In some embodiments, the resistance of the gate structure may be reduced by about 10% to about 20%. In some embodiments, seam defects of the gate structure may be reduced from about 578 defects each gate structure to about 4 defects in each gate structure. Manufacturing yields may be improved in some embodiments.

Figure 18B:
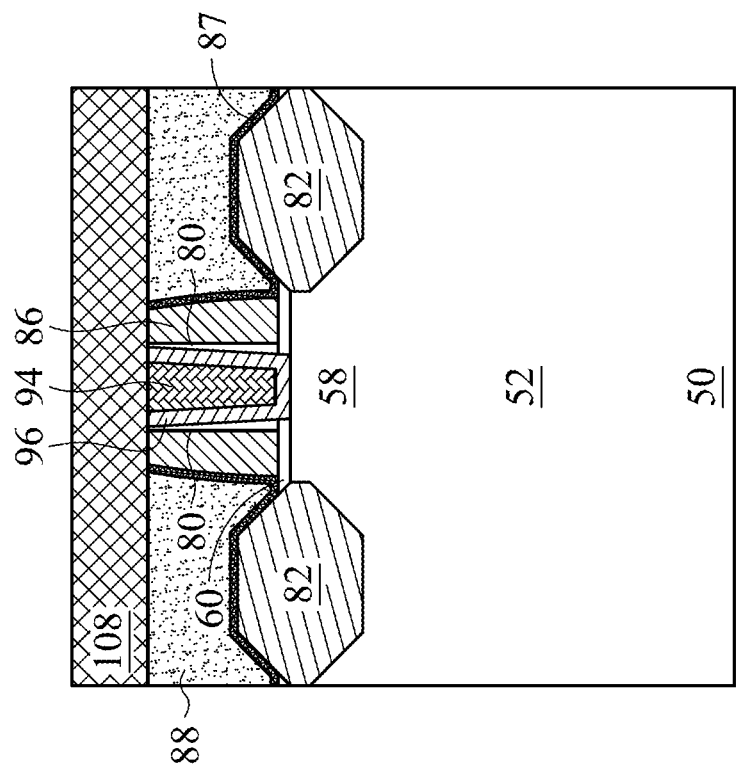
Figure 18A:
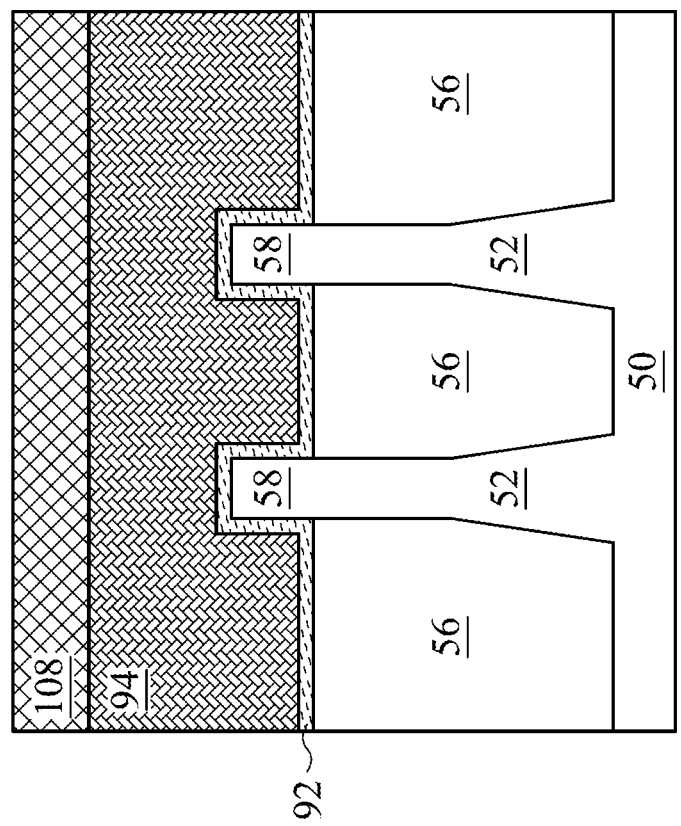

In FIGS. 18A and 18B, an ILD 108 is deposited over the ILD 88. In an embodiment, the ILD 108 is a flowable film formed by a flowable CVD method. In some embodiments, the ILD 108 is formed of a dielectric material such as PSG, BSG, BPSG, USG, or the like, and may be deposited by any suitable method, such as CVD and PECVD.

Figure 19B:
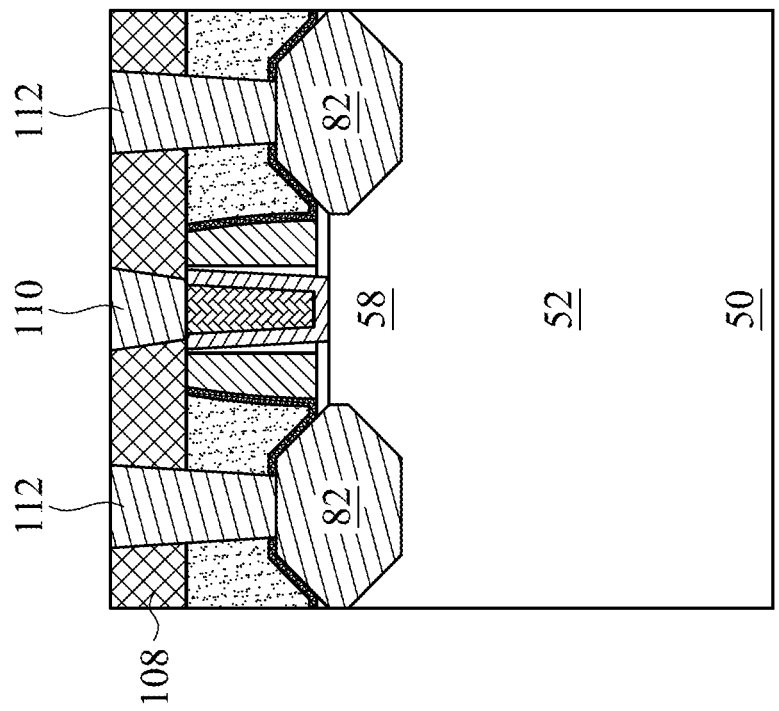
Figure 19A:
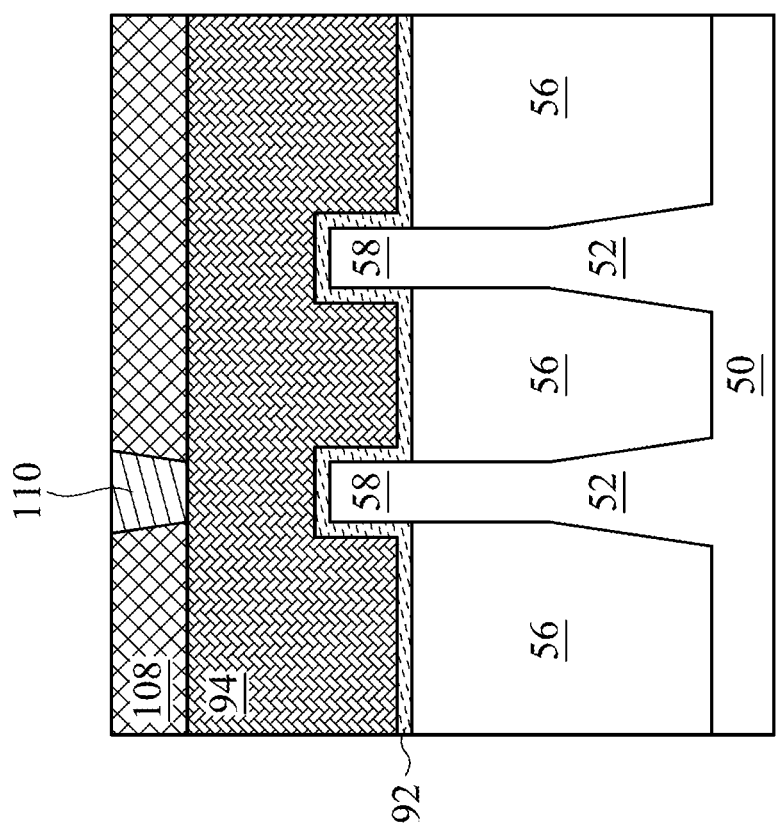

In FIGS. 19A and 19B, contacts 110 and 112 are formed through the ILD 108 and the ILD 88. The contacts 110 and 112 are formed of tungsten in some embodiments, although any suitable metal material may be used. In some embodiments, an anneal process may be performed to form a silicide at the interface between the epitaxial source/drain regions 82 and the contacts 112 prior to the contacts 112 being formed. The contact no is physically and electrically connected to the gate electrode 94, and the contacts 112 are physically and electrically connected to the epitaxial source/drain regions 82. FIGS. 19A and 19B illustrate the contacts 110 and 112 in a same cross-section; however, in other embodiments, the contacts 110 and 112 may be disposed in different cross-sections. Further, the position of contacts 110 and 112 in FIGS. 19A and 19B are merely illustrative and not intended to be limiting in any way. For example, the contact no may be vertically aligned with the fin 52 as illustrated or may be disposed at a different location on the gate electrode 94. Furthermore, the contacts 112 may be formed prior to, simultaneously with, or after forming the contacts 110.

As described herein, in some embodiments a dummy gate is formed, and a spacer is formed along sidewalls of the dummy gate. The dummy gate is removed, thereby forming a gate cavity having sidewalls that are defined at least by part by the spacer. A treatment is performed on portions of the exposed spacer sidewalls. In some embodiments, the treatment may include a plasma treatment. The treatment may change a material composition of the portions of the spacer. In some embodiments, for example because of the aspect ratio of the gate cavity, the treatment may penetrate more deeply into top portions of the spacer than bottom portions of the spacer. The treated portions of the spacer are then removed. Because the treatment process penetrated more deeply into the top portions of the spacer than the bottom portions of the spacer, the removal of the treated portions of the spacer may cause a larger portion of the top regions of the spacer to be removed than the bottom portions of the spacer. Accordingly, after the treated portions of the spacer are removed, a length of the gate cavity in at least a top portion of the gate cavity may be widened. A length of the gate cavity in a bottom portion of the gate cavity (for example near the channel region) may be substantially unchanged. Additionally, the gate cavity may have one or more tapered sidewalls. Next, a gate dielectric layer is deposited along sidewalls and a bottom surface of the cavity, and then the remaining portions of the gate cavity are filled by depositing one or more gate tuning layers and one or more gate electrode layers in the gate cavity.

Because of the widening of the opening in the top of the gate cavity, the filling of the gate cavity by the one or more gate tuning layers and one or more gate electrodes may be more easily performed. For example, in some processes where a gate cavity is filled by metal layers, such as gate tuning layers or gate electrode layers, when the cavity has a high aspect ratio the filling of the gate cavity may result in the creation of one or more voids and/or seams in the filled metal portions. A gate structure that contains a void or seam may experience a degradation of performance. For example, the gate resistance of the gate structure may be increased due to the presence of a void or seam. The gate structure may experience increased delay due to the presence or a void or seam. In accordance with some embodiments, the widening of the gate cavity enables filling of the gate cavity to be performed with reduced voids or cavities, or no voids or cavities. As such, performance of the gate structure may be improved.

A method is provided in accordance with some embodiments. The method includes forming a dummy dielectric layer over a substrate; forming a dummy gate over the dummy dielectric layer; forming a first spacer adjacent the dummy gate; removing the dummy gate to form a cavity, where the cavity is defined at least in part by the first spacer; performing a plasma treatment on portions of the first spacer, where the plasma treatment causes a material composition of the portions of the first spacer to change from a first material composition to a second material composition; etching the portions of the first spacer having the second material composition to remove the portions of the first spacer having the second material composition; and filling the cavity with a plurality of conductive materials to form a gate structure. In an embodiment the gate structure extends along remaining portions of the first spacer. In an embodiment the method also includes etching the dummy dielectric layer, where the portions of the first spacer having the second material composition and the dummy dielectric layer are etched in a single etching process. In an embodiment a depth of penetration of the plasma treatment into the first spacer varies according to a height of the first spacer. In an embodiment etching the portions of the first spacer having the second material composition to remove the portions of the first spacer having the second material composition causes remaining portions of the first spacer to have tapered sidewalls, where the tapered sidewalls face the cavity. In an embodiment a first tapered sidewall of the tapered sidewalls forms an angle with respect to a direction that is perpendicular to a major surface of the substrate, and the angle is in a range from 3 degrees to 50 degrees. In an embodiment etching the portions of the first spacer having the second material composition to remove the portions of the first spacer having the second material composition causes a top opening of the cavity to widen. In an embodiment the cavity is filled with the plurality of conductive materials through the top opening. In an embodiment the first material composition comprises oxygen at a first concentration, the second material composition comprises oxygen at a second concentration, and the second concentration is greater than the first concentration. In an embodiment the first material composition comprises nitrogen at a third concentration and carbon at a fourth concentration, and the second material composition comprises nitrogen at a fifth concentration and carbon at a sixth concentration, and the fifth concentration is less than the third concentration and the sixth concentration is less than the fourth concentration.

A method is provided in accordance with some embodiments. The method includes depositing and patterning a dummy gate over a dummy dielectric layer; forming a plurality of spacers surrounding the dummy gate; etching the dummy gate to form a gate cavity, the gate cavity being defined by the plurality of spacers; performing a plasma treatment on at least a portion of a first spacer of the plurality of spacers, where the portion of the first spacer is a portion of the first spacer that is farthest from the dummy dielectric layer; performing an etch process to remove the portion of the first spacer and a portion of the dummy dielectric layer, where after the etch process is completed a top opening of the gate cavity has been widened; depositing one or more gate dielectric layers and one or more gate electrode layers in the gate cavity through the top opening to form a gate structure; and forming an interlayer dielectric (ILD) surrounding the plurality of spacers. In an embodiment the method also includes performing a planarization process to planarize the ILD and the gate structure. In an embodiment, after the planarization process has been performed, a sidewall of the one or more gate dielectric layers extends at an angle with respect to a direction that is perpendicular to a planarized surface of the ILD, and the angle is in a range of 3 degrees to 50 degrees. In an embodiment performing the etch process to remove the portion of the first spacer causes remaining portions of the first spacer to have tapered sidewalls. In an embodiment the one or more gate dielectric layers and the one or more gate electrode layers comprise tapered sidewalls along portions of the one or more gate electrode layers and the one or more gate dielectric layers that extend along a remaining portion of the first spacer. In an embodiment the plasma treatment changes a material composition of the portion of the first spacer from a first material composition to a second material composition.

A device is provided in accordance with some embodiments. The device includes a plurality of source/drain regions formed in a substrate; a gate structure over the substrate between the plurality of source/drain regions, where the gate structure comprises one or more gate dielectric layers and one or more gate electrode layers; and a plurality of spacers surrounding the gate structure, where a first spacer of the plurality of spacers contacts the one or more gate dielectric layers, where the first spacer has a first thickness at a first location and a second thickness at a second location, where the first location is farthest from the substrate and the second location is between the first location and the substrate, and where a first sidewall of the first spacer that contacts the one or more gate dielectric layers extends at an angle between the first location and the second location, the angle is with respect to a direction that is perpendicular to a major surface of the substrate, and the angle is greater than or equal to 3 degrees. In an embodiment a sidewall of the one or more gate dielectric layers that contacts the first spacer extends at the same angle as the first sidewall of the first spacer. In an embodiment a second sidewall of the first spacer extends in the direction that is perpendicular to the major surface of the substrate, the second sidewall being opposite to the first sidewall. In an embodiment a thickness of the first spacer varies according to height of the first spacer between the first location and the second location, where the height is in the direction that is perpendicular to the major surface of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a first source/drain region and a second source/drain region over a substrate;
a gate structure over the substrate between the first source/drain region and the second source/drain region, wherein the gate structure comprises one or more gate dielectric layers and one or more gate electrode layers; and
a plurality of spacers along a first sidewall of the gate structure, wherein a width of each spacer of the plurality of spacers increases as each spacer approaches the substrate.

2. The device of claim 1, wherein an interface between the one or more gate dielectric layers and a first spacer of the plurality of spacers is inclined at an angle of inclination relative to an upper surface of the substrate under the gate structure.

3. The device of claim 2, wherein the angle of inclination is greater than or equal to 3 degrees.

4. The device of claim 1, wherein a first spacer of the plurality of spacers contacts a first gate dielectric layer of the one or more gate dielectric layers, wherein an upper surface of the first spacer is level with an upper surface of the first gate dielectric layer.

5. The device of claim 1, further comprising:
a dielectric layer on opposing sides of the gate structure, wherein a first spacer of the plurality of spacers contacts a first gate dielectric layer of the one or more gate dielectric layers, wherein an upper surface of the first spacer is level with an upper surface of the dielectric layer.

6. The device of claim 1, wherein an upper surface of a first spacer of the plurality of spacers is level with an upper surface of each remaining spacer of the plurality of spacers.

7. The device of claim 1, wherein a first spacer of the plurality of spacers contacts the one or more gate dielectric layers, wherein the first spacer comprises SiONC.

8. A device, comprising:
a first source/drain region and a second source/drain region formed in a substrate;
a gate structure over the substrate between the first source/drain region and the second source/drain region, wherein the gate structure comprises a gate dielectric layer and a gate electrode over the gate dielectric layer;
a first spacer contacting a sidewall of the gate structure; and
a second spacer contacting a sidewall of the first spacer, wherein the first spacer is between the second spacer and the gate structure, wherein a first width of the first spacer is greater adjacent the substrate than at a first location more distal from the substrate, wherein a second width of the second spacer is greater adjacent the substrate than at a second location more distal from the substrate.

9. The device of claim 8, wherein an interface between the first spacer and the second spacer is closer to perpendicular to an upper surface of the substrate under the gate structure than an interface between the first spacer and the gate structure.

10. The device of claim 8, wherein a width of the gate electrode at an upper surface is 0% to 30% greater than a width of the gate electrode at a lower surface.

11. The device of claim 8, wherein the gate structure contacts the second spacer.

12. The device of claim 8, further comprising a dielectric layer between the first spacer and the substrate.

13. The device of claim 12, wherein the dielectric layer is between the second spacer and the substrate.

14. The device of claim 12, wherein the gate dielectric layer extends along a sidewall of the dielectric layer.

15. The device of claim 8, wherein the first spacer comprises $Si_{1-x-y-z}O_xN_yC_z$, where x is about 45%±15%, y is about 15%±15% and z is 10%±10%.

16. A device, comprising:
a first source/drain region and a second source/drain region in a substrate;
a gate structure over the substrate between the first source/drain region and the second source/drain region, wherein the gate structure comprises a gate dielectric layer and a gate electrode over the gate dielectric layer;
a first spacer on a sidewall of the gate structure; and
a second spacer on a first sidewall of the first spacer opposite the gate structure, wherein a second sidewall of the first spacer tapers at an angle greater than the first sidewall of the first spacer relative to a line perpendicular to an upper surface of the substrate.

17. The device of claim 16, wherein the angle is greater than or equal to 3 degrees relative to a line perpendicular to the upper surface of the substrate.

18. The device of claim 16, wherein a bottom surface of the first spacer is level with a bottom surface of the second spacer.

19. The device of claim 16, wherein the gate dielectric layer extends closer to the substrate than the first spacer.

20. The device of claim 16, wherein a width of the gate structure at an upper surface is between 0% and 30% greater than a width of the gate structure at a lower surface.

* * * * *